(12) United States Patent
Lieber et al.

(10) Patent No.: US 8,058,640 B2
(45) Date of Patent: Nov. 15, 2011

(54) BRANCHED NANOSCALE WIRES

(75) Inventors: Charles M. Lieber, Lexington, MA (US); Bozhi Tian, Cambridge, MA (US); Xiaocheng Jiang, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 12/310,764

(22) PCT Filed: Sep. 11, 2007

(86) PCT No.: PCT/US2007/019669
§ 371 (c)(1),
(2), (4) Date: Nov. 23, 2009

(87) PCT Pub. No.: WO2008/033303
PCT Pub. Date: Mar. 20, 2008

(65) Prior Publication Data
US 2011/0042641 A1 Feb. 24, 2011

Related U.S. Application Data

(60) Provisional application No. 60/843,681, filed on Sep. 11, 2006.

(51) Int. Cl.
*C30B 21/02* (2006.01)
(52) U.S. Cl. ............................................ 257/14; 117/86
(58) Field of Classification Search .................. 117/86, 117/87, 89, 94, 95; 257/14, 17, 22, E29.07; 977/762
See application file for complete search history.

(56) References Cited

U.S. PATENT DOCUMENTS 3,873,359 A 3/1975 Lando
(Continued)

FOREIGN PATENT DOCUMENTS

CN 1110786 10/1995
(Continued)

OTHER PUBLICATIONS

Agarwal, R., et al., "Lasing in Single Cadmium Sulfide Nanowire Optical Cavities," *Nano Letters*, vol. 5, No. 5, pp. 917-920 (2005).
(Continued)

*Primary Examiner* — Thomas L Dickey
(74) *Attorney, Agent, or Firm* — Wolf, Greenfield & Sacks, P.C.

(57) ABSTRACT

The present invention generally relates to nanotechnology and, in particular, to branched nanoscale wires. In some cases, the branched nanoscale wires may be produced using vapor-phase and/or solution-phase synthesis. Branched nanoscale wires may be grown by depositing nanoparticles onto a nanoscale wire, and segments or "branches" can then be grown from the nanoparticles. The nanoscale wire may be any nanoscale wire, for example, a semiconductor nanoscale wire, a nanoscale wire having a core and a shell. The segments may be of the same, or of different materials, than the nanoscale wire, for example, semiconductor/metal, semiconductor/semiconductor. The junction between the segment and the nanoscale wire, in some cases, is epitaxial. In one embodiment, the nanoparticles are adsorbed onto the nanoscale wire by immobilizing a positively-charged entity, such as polylysine, to the nanoscale wire, and exposing it to the nanoparticles. In another embodiment, nanoparticles are deposited onto a nanoscale wire by etching the nanoscale wire to produce an H-terminated surface, then exposing the surface to a solution comprising a metal ion, which can be reduced by the surface to form nanoparticles. Segments or branches can then be grown from the deposited nanoparticles to form the branched nanoscale wire.

20 Claims, 12 Drawing Sheets

U.S. PATENT DOCUMENTS

| | | |
|---|---|---|
| 3,873,360 A | 3/1975 | Lando |
| 3,900,614 A | 8/1975 | Lando |
| 4,673,474 A | 6/1987 | Ogawa |
| 4,939,556 A | 7/1990 | Eguchi et al. |
| 5,023,139 A | 6/1991 | Birnboim et al. |
| 5,089,545 A | 2/1992 | Pol |
| 5,252,835 A | 10/1993 | Lieber et al. |
| 5,274,602 A | 12/1993 | Glenn |
| 5,453,970 A | 9/1995 | Rust et al. |
| 5,475,341 A | 12/1995 | Reed |
| 5,512,131 A | 4/1996 | Kumar et al. |
| 5,524,092 A | 6/1996 | Park |
| 5,537,075 A | 7/1996 | Miyazaki |
| 5,539,214 A | 7/1996 | Lynch et al. |
| 5,581,091 A | 12/1996 | Moskovits et al. |
| 5,589,692 A | 12/1996 | Reed |
| 5,607,876 A | 3/1997 | Biegelsen et al. |
| 5,620,850 A | 4/1997 | Bamdad et al. |
| 5,640,343 A | 6/1997 | Gallagher et al. |
| 5,726,524 A | 3/1998 | Debe |
| 5,739,057 A | 4/1998 | Tiwari et al. |
| 5,747,180 A | 5/1998 | Miller et al. |
| 5,751,156 A | 5/1998 | Muller et al. |
| 5,776,748 A | 7/1998 | Singhvi et al. |
| 5,824,470 A | 10/1998 | Baldeschwieler et al. |
| 5,830,538 A | 11/1998 | Gates et al. |
| 5,840,435 A | 11/1998 | Lieber et al. |
| 5,847,565 A | 12/1998 | Narayanan |
| 5,858,862 A | 1/1999 | Westwater et al. |
| 5,864,823 A | 1/1999 | Levitan |
| 5,866,434 A | 2/1999 | Massey et al. |
| 5,897,945 A | 4/1999 | Lieber et al. |
| 5,900,160 A | 5/1999 | Whitesides et al. |
| 5,903,010 A | 5/1999 | Flory et al. |
| 5,908,692 A | 6/1999 | Hamers et al. |
| 5,916,642 A | 6/1999 | Chang |
| 5,942,443 A | 8/1999 | Parce et al. |
| 5,997,832 A | 12/1999 | Lieber et al. |
| 6,004,444 A | 12/1999 | Aksay et al. |
| 6,036,774 A | 3/2000 | Lieber et al. |
| 6,038,060 A | 3/2000 | Crowley |
| 6,060,121 A | 5/2000 | Hidber et al. |
| 6,060,724 A | 5/2000 | Flory et al. |
| 6,069,380 A | 5/2000 | Chou et al. |
| 6,123,819 A | 9/2000 | Peeters |
| 6,128,214 A | 10/2000 | Kuekes et al. |
| 6,143,184 A | 11/2000 | Martin et al. |
| 6,149,819 A | 11/2000 | Martin et al. |
| 6,159,742 A | 12/2000 | Lieber et al. |
| 6,180,239 B1 | 1/2001 | Whitesides et al. |
| 6,187,165 B1 | 2/2001 | Chien et al. |
| 6,190,634 B1 | 2/2001 | Lieber et al. |
| 6,203,864 B1 | 3/2001 | Zhang et al. |
| 6,207,392 B1 | 3/2001 | Weiss et al. |
| 6,211,464 B1 | 4/2001 | Mochizuki et al. |
| 6,231,744 B1 | 5/2001 | Ying et al. |
| 6,256,767 B1 | 7/2001 | Kuekes et al. |
| 6,270,074 B1 | 8/2001 | Rasmussen et al. |
| 6,278,231 B1 | 8/2001 | Iwasaki et al. |
| 6,286,226 B1 | 9/2001 | Jin |
| 6,287,765 B1 | 9/2001 | Cubicciotti |
| 6,314,019 B1 | 11/2001 | Kuekes et al. |
| 6,325,904 B1 | 12/2001 | Peeters |
| 6,340,822 B1 | 1/2002 | Brown et al. |
| 6,346,189 B1 | 2/2002 | Dai et al. |
| 6,355,198 B1 | 3/2002 | Kim et al. |
| 6,359,288 B1 | 3/2002 | Ying et al. |
| 6,437,329 B1 | 8/2002 | Yedur et al. |
| 6,440,637 B1 | 8/2002 | Choi et al. |
| 6,451,113 B1 | 9/2002 | Givargizov |
| 6,459,095 B1 | 10/2002 | Heath et al. |
| 6,465,132 B1 | 10/2002 | Jin |
| 6,468,657 B1 | 10/2002 | Hou et al. |
| 6,468,677 B1 | 10/2002 | Benton et al. |
| 6,503,375 B1 | 1/2003 | Maydan et al. |
| 6,528,020 B1 | 3/2003 | Dai et al. |
| 6,538,367 B1 | 3/2003 | Choi et al. |
| 6,559,468 B1 | 5/2003 | Kuekes et al. |
| 6,586,095 B2 | 7/2003 | Wang et al. |
| 6,628,053 B1 | 9/2003 | Den et al. |
| 6,716,409 B2 | 4/2004 | Hafner et al. |
| 6,741,019 B1 | 5/2004 | Filas et al. |
| 6,743,408 B2 | 6/2004 | Lieber et al. |
| 6,756,025 B2 | 6/2004 | Colbert et al. |
| 6,756,795 B2 | 6/2004 | Hunt et al. |
| 6,762,056 B1 | 7/2004 | Peeters |
| 6,781,166 B2 | 8/2004 | Lieber et al. |
| 6,803,840 B2 | 10/2004 | Hunt et al. |
| 6,808,746 B1 | 10/2004 | Dai et al. |
| 6,815,706 B2 | 11/2004 | Li et al. |
| 6,822,051 B2 | 11/2004 | Harris |
| 6,846,565 B2 | 1/2005 | Korgel et al. |
| 6,872,645 B2 | 3/2005 | Duan et al. |
| 6,882,767 B2 | 4/2005 | Yang et al. |
| 6,902,720 B2 | 6/2005 | McGimpsey |
| 6,946,197 B2 | 9/2005 | Yadav et al. |
| 6,958,216 B2 | 10/2005 | Kelley et al. |
| 6,962,823 B2 | 11/2005 | Empedocles et al. |
| 6,974,706 B1 | 12/2005 | Melker et al. |
| 6,996,147 B2 | 2/2006 | Majumdar et al. |
| 7,048,903 B2 | 5/2006 | Colbert et al. |
| 7,129,554 B2 | 10/2006 | Lieber et al. |
| 7,172,953 B2 | 2/2007 | Lieber et al. |
| 7,211,464 B2 | 5/2007 | Lieber et al. |
| 7,254,151 B2 | 8/2007 | Lieber et al. |
| 7,256,466 B2 | 8/2007 | Lieber et al. |
| 7,301,199 B2 | 11/2007 | Lieber et al. |
| 7,303,875 B1 | 12/2007 | Bock et al. |
| 7,335,908 B2 | 2/2008 | Samuelson et al. |
| 7,385,267 B2 | 6/2008 | Lieber et al. |
| 7,399,691 B2 | 7/2008 | Lieber et al. |
| 2001/0054709 A1 | 12/2001 | Heath et al. |
| 2002/0013031 A1 | 1/2002 | Chen et al. |
| 2002/0040805 A1 | 4/2002 | Swager |
| 2002/0055239 A1 | 5/2002 | Tuominen et al. |
| 2002/0084502 A1 | 7/2002 | Jang et al. |
| 2002/0086335 A1 | 7/2002 | Massey et al. |
| 2002/0112814 A1 | 8/2002 | Hafner et al. |
| 2002/0117659 A1 | 8/2002 | Lieber et al. |
| 2002/0122766 A1 | 9/2002 | Lieber et al. |
| 2002/0130311 A1 | 9/2002 | Lieber et al. |
| 2002/0130353 A1 | 9/2002 | Lieber et al. |
| 2002/0146714 A1 | 10/2002 | Lieber et al. |
| 2002/0158342 A1 | 10/2002 | Tuominen et al. |
| 2002/0172820 A1 | 11/2002 | Majumdar et al. |
| 2002/0175408 A1 | 11/2002 | Majumdar et al. |
| 2002/0179434 A1 | 12/2002 | Dai et al. |
| 2002/0187504 A1 | 12/2002 | Reich et al. |
| 2003/0001091 A1 | 1/2003 | Nakayama et al. |
| 2003/0003300 A1 | 1/2003 | Korgel et al. |
| 2003/0032892 A1 | 2/2003 | Erlach et al. |
| 2003/0048619 A1 | 3/2003 | Kaler et al. |
| 2003/0073071 A1 | 4/2003 | Fritz et al. |
| 2003/0089899 A1 | 5/2003 | Lieber et al. |
| 2003/0098488 A1 | 5/2003 | O'Keeffe et al. |
| 2003/0113713 A1 | 6/2003 | Glezer et al. |
| 2003/0113940 A1 | 6/2003 | Erlanger et al. |
| 2003/0121764 A1 | 7/2003 | Yang et al. |
| 2003/0124509 A1 | 7/2003 | Kenis et al. |
| 2003/0124717 A1 | 7/2003 | Awano et al. |
| 2003/0134267 A1 | 7/2003 | Kang et al. |
| 2003/0134433 A1 | 7/2003 | Gabriel et al. |
| 2003/0135971 A1 | 7/2003 | Liberman et al. |
| 2003/0145779 A1* | 8/2003 | Alivisatos et al. ............... 117/2 |
| 2003/0156992 A1 | 8/2003 | Anderson et al. |
| 2003/0186522 A1 | 10/2003 | Duan et al. |
| 2003/0186544 A1 | 10/2003 | Matsui et al. |
| 2003/0189202 A1 | 10/2003 | Li et al. |
| 2003/0197456 A1 | 10/2003 | Den et al. |
| 2003/0200521 A1 | 10/2003 | DeHon et al. |
| 2004/0005723 A1 | 1/2004 | Empedocles et al. |
| 2004/0026684 A1 | 2/2004 | Empedocles |
| 2004/0067530 A1 | 4/2004 | Gruner |
| 2004/0095658 A1 | 5/2004 | Buretea et al. |
| 2004/0106203 A1 | 6/2004 | Stasiak et al. |
| 2004/0112964 A1 | 6/2004 | Empedocles et al. |
| 2004/0113138 A1 | 6/2004 | DeHon et al. |

| | | | |
|---|---|---|---|
| 2004/0113139 A1 | 6/2004 | DeHon et al. | |
| 2004/0118448 A1 | 6/2004 | Scher et al. | |
| 2004/0136866 A1 | 7/2004 | Pontis et al. | |
| 2004/0146560 A1 | 7/2004 | Whiteford et al. | |
| 2004/0157414 A1 | 8/2004 | Gole et al. | |
| 2004/0188721 A1 | 9/2004 | Lieber et al. | |
| 2004/0191517 A1 | 9/2004 | Drake | |
| 2004/0213307 A1 | 10/2004 | Lieber et al. | |
| 2005/0037374 A1 | 2/2005 | Melker et al. | |
| 2005/0064185 A1 | 3/2005 | Buretea et al. | |
| 2005/0064731 A1 | 3/2005 | Park et al. | |
| 2005/0066883 A1 | 3/2005 | Dubrow et al. | |
| 2005/0072213 A1 | 4/2005 | Besnard et al. | |
| 2005/0079533 A1 | 4/2005 | Samuelson et al. | |
| 2005/0079659 A1 | 4/2005 | Duan et al. | |
| 2005/0100960 A1 | 5/2005 | Dai et al. | |
| 2005/0101026 A1 | 5/2005 | Sailor et al. | |
| 2005/0109989 A1 | 5/2005 | Whiteford et al. | |
| 2005/0110064 A1 | 5/2005 | Duan et al. | |
| 2005/0117441 A1 | 6/2005 | Lieber et al. | |
| 2005/0161662 A1 | 7/2005 | Majumdar et al. | |
| 2005/0181587 A1 | 8/2005 | Duan et al. | |
| 2005/0201149 A1 | 9/2005 | Duan et al. | |
| 2005/0202615 A1 | 9/2005 | Duan et al. | |
| 2005/0211154 A1* | 9/2005 | Alivisatos et al. | 117/1 |
| 2005/0212079 A1 | 9/2005 | Stumbo et al. | |
| 2005/0214967 A1 | 9/2005 | Scher et al. | |
| 2005/0219788 A1 | 10/2005 | Chow et al. | |
| 2005/0230356 A1 | 10/2005 | Empedocles et al. | |
| 2005/0253137 A1 | 11/2005 | Whang et al. | |
| 2005/0266662 A1 | 12/2005 | Yi | |
| 2005/0287717 A1 | 12/2005 | Heald et al. | |
| 2006/0008942 A1 | 1/2006 | Romano et al. | |
| 2006/0009003 A1 | 1/2006 | Romano et al. | |
| 2006/0019472 A1 | 1/2006 | Pan et al. | |
| 2006/0054936 A1 | 3/2006 | Lieber et al. | |
| 2006/0057360 A1 | 3/2006 | Samuelson et al. | |
| 2006/0160246 A1 | 7/2006 | Massey et al. | |
| 2006/0175601 A1 | 8/2006 | Lieber et al. | |
| 2006/0237749 A1 | 10/2006 | Lieber et al. | |
| 2006/0269927 A1 | 11/2006 | Lieber et al. | |
| 2007/0026645 A1 | 2/2007 | Lieber et al. | |
| 2007/0032023 A1 | 2/2007 | Lieber et al. | |
| 2007/0032051 A1 | 2/2007 | Lieber et al. | |
| 2007/0032052 A1 | 2/2007 | Lieber et al. | |
| 2007/0048492 A1 | 3/2007 | Lieber et al. | |
| 2007/0158766 A1 | 7/2007 | Lieber et al. | |
| 2007/0252136 A1 | 11/2007 | Lieber et al. | |
| 2007/0281156 A1 | 12/2007 | Lieber et al. | |
| 2008/0191196 A1 | 8/2008 | Lu et al. | |
| 2009/0004852 A1 | 1/2009 | Lieber et al. | |

FOREIGN PATENT DOCUMENTS

| | | |
|---|---|---|
| EP | 1087413 | 3/2001 |
| EP | 1170799 | 1/2002 |
| JP | 09-191104 | 7/1997 |
| JP | 11-11917 | 1/1999 |
| JP | 2000/31462 | 1/2000 |
| JP | 2001/281965 | 10/2001 |
| WO | WO 91/06036 A1 | 5/1991 |
| WO | WO 95/02709 A2 | 1/1995 |
| WO | WO 96/29629 A2 | 9/1996 |
| WO | WO 97/32571 A1 | 9/1997 |
| WO | WO 97/33737 A1 | 9/1997 |
| WO | WO 97/34025 A1 | 9/1997 |
| WO | WO 97/34140 A1 | 9/1997 |
| WO | WO 98/39250 A1 | 9/1998 |
| WO | WO 98/48456 A1 | 10/1998 |
| WO | WO 99/24823 A1 | 5/1999 |
| WO | WO 98/42620 A1 | 10/1999 |
| WO | WO 99/63347 A2 | 12/1999 |
| WO | WO 00/09443 A1 | 2/2000 |
| WO | WO 00/17101 A1 | 3/2000 |
| WO | WO 00/19494 A1 | 4/2000 |
| WO | WO 00/29617 A3 | 5/2000 |
| WO | WO 00/51186 A1 | 8/2000 |
| WO | WO 01/03208 A1 | 1/2001 |
| WO | WO 01/44796 A1 | 6/2001 |
| WO | WO 02/17362 A2 | 2/2002 |
| WO | WO 02/31183 A1 | 4/2002 |
| WO | WO 02/48701 A2 | 6/2002 |
| WO | WO 02/08028 A1 | 10/2002 |
| WO | WO 02/086480 A1 | 10/2002 |
| WO | WO 03/005450 A2 | 1/2003 |
| WO | WO 03/016901 A1 | 2/2003 |
| WO | WO 03/053851 A2 | 7/2003 |
| WO | WO 03/054931 A1 | 7/2003 |
| WO | WO 03/063208 A2 | 7/2003 |
| WO | WO 2004/003535 | 1/2004 |
| WO | WO 2004/010552 A1 | 1/2004 |
| WO | WO 2004/032190 A2 | 4/2004 |
| WO | WO 2004/032193 A2 | 4/2004 |
| WO | WO 2004/034025 A2 | 4/2004 |
| WO | WO 2004/038767 A2 | 5/2004 |
| WO | WO 2005/089165 | 9/2005 |
| WO | WO 2005/093831 A1 | 10/2005 |
| WO | WO 2005/094440 | 10/2005 |
| WO | WO 2005/114282 A2 | 12/2005 |
| WO | WO 2005/119753 A2 | 12/2005 |
| WO | WO 2006/107312 A1 | 10/2006 |
| WO | WO 2006/132659 A2 | 12/2006 |
| WO | WO 2007/044034 A2 | 4/2007 |
| WO | WO 2007/145701 A2 | 12/2007 |
| WO | WO 2008/027078 A2 | 3/2008 |
| WO | WO 2008/033303 A2 | 3/2008 |
| WO | WO 2008/123869 A2 | 10/2008 |
| WO | WO 2008/127314 A1 | 10/2008 |

OTHER PUBLICATIONS

Balavoine, F., et al., "Helical Crystallization of Proteins on Carbon Nanotubes: A First Step towards the Development of New Biosensors," *Agnew. Chem.*, vol. 38, pp. 1912-1915 (1999).

Chen et al., "Large on-off ratios and negative differential resistance in a molecular electronic device", *Science*, Nov. 19, 1999, 286:1550-51.

Chen, R.J., et al., "Noncovalent functionalization of carbon nanotubes for highly specific electronic biosensors," *PNAS*, vol. 100, No. 9, pp. 4984-4989 (2003).

Cheung et al., "Diameter Controlled Synthesis of Carbon Nanotubes," *J. Phys. Chem B*, 2002, 106:2429-2433.

Choi, K.J., et al., "Enhancement of Ferroelectricity in Strained BaTiO Thin Films," *Science*, vol. 306, pp. 1005-1009 (2004).

Chung et al., "Silico nanowire devices," *App. Phys. Letters*, 2000, 76(15):2069-2070.

Collier et al., "Electronically configurable molecular-based logic gates," *Science*, 1999, 285:391-394.

Cui et al., "Diameter-controlled synthesis of single-crystal silicon nanowires," *Appl. Phys. Letters*, 2001, 78(15): 2214-2216.

Cui et al., "Doping and Electrical Transport in Silicon Nanowires," *J. Phys. Chem.*, 2000, 104(22):5214-5216.

Cui et al., "Functional nanoscale electronic devices assembled using silicon nanowire building blocks", *Science*, Feb. 2, 2001, 291:851-853.

Cui et al., "Nanowire nanosensors for highly sensitive and selective detection of biological and chemical species", *Science*, Aug. 17, 2001, 293:1289-1292.

Duan et al., "General Synthesis of Compound Semiconductor Nanowires," *Adv. Mat.*, 2000, 12(4):298-302.

Duan et al., "High-performance thin-film transistors using semiconductor nanowires and nanoribbons," *Nature*, 2003, 425:274-278.

Duan et al., "Laser-Assisted Catalytic Growth of Single Crystal GaN Nanowires," *J.Am.Chem.Soc.*, 2000, 122:188-189.

Duan et al., "Nonvolatile Memory and Programmable Logic from Molecule-Gated Nanowires," *Nano Letters*, 2002, 2(5):487-490.

Duan et al.., "Indium phosphide nanowires as building blocks for nanoscale electronic and optoelectronic devices," *Nature*, Jan. 4, 2001, 409:66-69.

Duan, X., et al., "Single-nanowire elecrtrically driven lasers," *Nature*, vol. 421, pp. 241-245(2003).

Duan, X., et al., "Synthesis and optical properties of gallium arsenide nanowires," *Applied Physics Letters*, vol. 76, No. 9, pp. 1116-1118 (2000).

Esfarjani et al., "Electronic and transport properties of N-P doped nanotubes," *Applied Physics Letters*, 1999, 74:79-81.

Fagan, S., et al., "Ab initio calculation for a hypothetical material: Silicon nanotubes," *Physical Review*, vol. 61, No. 15, pp. 9994-9996 (2000).

Friedman, R.S., et al., "High-speed integrated nanowire circuits," *Nature*, vol. 434, pp. 1085 (2005).

Givargizov, "Fundamental aspects of VSL growth", *Journal of Crystal Growth*, 1975, 31:20-30.

Gradecak, S., et al., "GaN nanowire lasers with low lasing thresholds," *Applied Physics Letters*, vol. 87, pp. 173111 (2005).

Gudiksen et al., "Diameter-Selective Synthesis of Semiconductor Nanowires," *J.Am.Chem.Soc.*, 2000, 122, 8801-8802.

Gudiksen et al., "Growth of nanowire superlattice structures for nanoscale photonics and electronics", *Nature*, 2002, 415:617-620.

Gudiksen et al., "Size-Dependent Photoluminescence from Single Indium Phosphide Nanowires," *J. Phys. Chem.*, 2002, 106:4036-4039.

Gudiksen et al., "Synthetic Control of the Diameter and Length of Single Crystal Semiconductor Nanowires," *J. Phys. Chem.*, 2001, 105:4062-4064.

Guo et al., "A Silicon Single-Electron Transistor Memory Operating at Room Temperature," *Science*, 275:649-651.

Guo et al., "Nanoscale silicon field effect transistors fabricated using implant lithography," *Appl. Phys. Lett.*, 71(13):1881-1883.

Hahm, J., et al., "Direct Ultrasensitive Electrical Detection of DNA and DNA Sequence Variations Using Nanowire Nanosensors," *Nano Letters*, vol. 4, No. 1, pp. 51-54 (2004).

Haraguchi et al., "GaAs p-n junction formed in quantum wire crystals," *App. Phys. Letters*, 1992, 60(6):745-747.

Haraguchi et al., "Polarization dependence of light emitted from GaAs p-n junctions in quantum wire crystals", *Journal of Applied Physics*, Apr. 1994, 75(8): 4220-4225.

Heath, J. R., et al., "A liquid solution synthesis of single crystal germanium quantum wires," *Chemical Physics Letters*, vol. 208, No. 3, 4, pp. 263-268 (1993).

Hiruma, et al., "GaAs fr e-standing quantum-siz wires," *J. Appl. Phys.*, vol. 74, No. 5, pp. 3162 (1993).

Hiruma et al., "Self-organized growth of GaAs/InAs heterostructure nanocylinders by organometallic vapor phase epitaxy", *Journal of Crystal Growth*, 1996, 163: 226-231.

Holmes et al., "Control of Thickness and Orientation of Solution-Grown Silicon Nanowires," *Science*, 2000, 287:1471-1473.

Hsu et al., "MFMox Ferroelectric Transistor," Nonvolatile Memory Technology Symposium, Orlando, FL, Nov. 15-17, 2004, p. 24-27.

Hu et al., "Chemistry and Physics in One Dimension: Synthesis and Properties of Nanowires and Nanotubes," *Acc. Chem. Res.*, 1999, 32(5):435-445.

Hu et al., "Controlled growth and electrical properties of heterojunctions of carbon nanotubes and silicon nanowires," *Nature*, 1999, 399:48-51.

Hu et al., "Serpentine Superlattice Nanowire-Array Lasers," *IEEE J. Quantum Elec.*, 1995, 31(8):1380-1388.

Huang et al., "Directed assembly of one-dimensional nanostructures into functional networks", *Science*, Jan. 26, 2001, 291: 630-633.

Huang et al., "Gallium Nitride Nanowire Nanodevices," *Nano Letters*, 2002, 2(2):101-104.

Huang et al., "Logic Gates and Computation from Assembled Nanowire Building Blocks," *Science*, 2001, 294:1313-1317.

Huang et al., "Room-Temperature Ultraviolet Nanowire Nanolasers," *Science*, 2001, 292:897-1898.

IBM News, "IBM creates highest performing nanotube transistors" http://www.ibm.com/news/us/2002/05/20.html.

Javey, A., et al., "Ballistic carbon nanotube field-effect transistors," *Nature*, vol. 424, pp. 654 (2003).

Jensen, et al., "Kinetics for Hybridization of Peptide Nucleic Acids (PNA) with DNA and RNA Studied with the BIAcore Technique," *Biochemistry*, vol. 36, pp. 5072-5077 (1997).

Jin et al., "Scalable Interconnection and Integration of Nanowire Devices without Registration," *NanoLetters*, 2004, 4(5):915-919.

Johnson et al., "Single gallium nitride nanowire lasers," *Nature*, 2002, 1: 106-110.

Johnson et al., "Single Nanowire Lasers," *J. Phys. Chem.*, 2001, 105(46):11387-11390.

Joselevich et al., "Vectorial Growth of Metallic and Semiconducting Single-Wall Carbon Nanotubes," *Nano Letters*, 2002, 2(10):1137-1141.

Kanjanachuchai et al., "Coulomb blockade in strained-Si nanowires on leaky virtual substrates", *Semiconductor Science and Technology*, 2001, 16:72-76.

Kong et al., "Chemical vapor deposition of methane for single-walled carbon nanotubes," *Chem. Physics Letters*, 1998, 292:567-574.

Kong et al., "Nanotube molecular wires as chemical sensors", *Science*, Jan. 28, 2000, 287: 622-625.

Kong et al., "Synthesis of individual single-walled carbon nanotubes on patterned silicon wafers," *Nature*, 1998, 395:878-881.

Lahoun et al., "Epitaxial core-shell and core-multishell nanowire heterostructures", *Nature*, 2002, 420: 57-61.

Lahoun et al., "Semiconductor nanowire heterostructures," *Phil. Trans. R. Soc. Lond. A*, 2004, 362:1247-1260.

Law, M., et al., "Nanoribbon Waveguides for Subwavelength Photonics Integration," *Science*, vol. 305, pp. 1269-1274 (2004).

Leff, D.V., et al., "Thermodynamic Control of Gold Nanocrystal Size: Experiment and Theory," *J. Phys. Chem.*, vol. 99, pp. 7036-7041 (1995).

Lei, B., et al., "Nanowire transistors with ferroelectric gate dielectrics: Enhanced performance and memory effects," *Applied Physics Letters*, vol. 84, No. 22, pp. 4553-4555 (2004).

Li, et al., "Sequence-Specific Label-Free DNA Sensors Based on Silicon Nanowires," *Nano Letters*, vol. 4, No. 2, pp. 245-247 (2004).

Li, et al., "Fabrication of stable metallic nanowires with quantized conductance," *Nanotechnology*, vol. 10, pp. 221-223 (1999).

Lieber, "Nanoscale Science and Technology: Building a Big Future from Small Things," *MRS Bulletin*, 2003, 486-491.

Lieber, C., "Nanowire Superlattices," *Nano Letters*, vol. 2, No. 2, pp. 81-82 (2002).

Lu, W., et al., "One dimensional hole gas in germanium/silicon nanowire heterostructures," *PNAS*, vol. 102, No. 29, pp. 10046-10051 (2005).

MacBeath, et al., "Printing Proteins as Microarrays for High-Throughput Function Determination," *Science*, vol. 289, pp. 1760 (2000).

Martel, et al., "Single- and multi-wall carbon nanotube field-effect transistors," *Apl. Phys. Lett.*, 1998, 73(17):2447-2449.

McAlpine et al., "High-Performance Nanowire Electronics and Photonics and Nanoscale Patterning on Flexible Plastic Substrates," *Proc. of the IEEE*, 2005, 93(7):1357-1363.

McAlpine et al., "Nanoimprint Lithogrphy for Hybrid Plastic Electronics," *Nano Letters*, 2003, 3(4):443-445.

McAlpine, et al., "High-Performance Nanowire Electronics and Photonics on Glass and Plastic Substrates," *Nano-Letters*, 2003, 3(11):1531-1535.

Menon, V.P., et al., "Fabrication and Evaluation of Nanoelectrode Ensembles," *Anal. Chem.*, vol. 67, pp. 1920-1928 (1995).

Mitchell, et al., "Smart Nanotubes for Bioseparations and Biocatalysis," *JACS*, vol. 124, pp. 11864-11865 (2002).

Mizutani, T., et al., "Fabrication and characterization of carbon nanotube FETs," *Proceedings of SPIE*, vol. 5732, pp. 28-36 (2005).

Morales et al., "A Laser Ablation Method for the Synthesis of Crystalline Semiconductor Nanowires," *Science*, 1998, 279: 208-211.

Musin, R.N., et al., "Structural and electronic properties of epitaxial core-shell nanowire heterostructures," *Physical Review*, vol. 71, pp. 155318-1155381-4 (2005).

Nosho, Y., et al., "*n*-type carbon nanotube field-effect transistors fabricated by using Ca contact electrodes," *Applied Physics Letters*, vol. 86, pp. 073105 (2005).

Neuman, et al., "Microarray profiling of antiviral antibodies for the development of diagnostics, vaccines, and therapeutics," *Clinical Immunology*, vol. 111, pp. 196-201 (2004).

Padeste et al., "Modular amperometric immunosensor devices", 8th International Conference on Solid-State Sensors an Actuators and Eurosensors, 1995, 487-490.

Patolsky, F., et al., "Electrical detection of single viruses," *PNAS*, vol. 101, No. 39, pp. 14017-14022 (2004).

Patolsky, F., et al., "Nanowire Nanosensors," *Materials Today*, pp. 20-28 (2005).

Patolsky, F., et al., "Nanowire-Based Biosensors," *Analytical Chemistry*, pp. 4261 (2006).

Patolsky, F., et al., "Nanowire sensors for medicine and the life sciences," *Nanomedicine*, vol. 1, No. 1, pp. 51-65 (2006).

Pavesi, L., et al., "Optical gain in silicon nanocrystals," *Nature*, vol. 408, pp. 440-444 (2000).

Qi, P., et al., "Toward Large Arrays of Multiplex Functionalized Carbon Notube Sensors for Highly Sensitive and Selective Molecular Detection," *Nano Letters*, vol. 3, No. 3, pp. 347-351 (2003).

Rueckes et al., "Carbon Nanotube-Based Nonvolatile Random Access Memory for Molecular Computing," *Science*, 2000, 289,:94-97.

Shi, Y., et al., "Long Si nanowires with millimeter-scale length by modified thermal evaporation from Si powder," *Appl. Phys.*, vol. 80, pp. 1733-1736 (2005).

Smalley, et al., "Biochip spots single viruses," *Late Tech. Research News*, Oct. 20, 2004.

Soh, H.T., et al., "Integrated nanotube circuits: Controlled growth and ohmic contacting of single-walled carbon nanotubes," *App. Phys. Lett.*, vol. 75, No. 5, pp. 627 (1999).

Star et al., "Preparation and properties of polymer-wrapped single-walled carbon nanotubes", *Angew. Chem. Int.*, 2001, 40(9): 1721-25.

Takayama et al., "Patterning cells and their environments using multiple laminar fluid flows in capillary networks", Proc. Natl. Acad. Sci., 1999, 96:5545-5548.

Tang, Y.H., et al., "Si nanowires synthesized by laser ablation of mixed SiC and $SiO_2$ powders," *Chemical Physics Letters*, vol. 314, pp. 16-20 (1999).

Tans et al., "Room-temperature transistor based on a single carbon nanotube," *Nature*, 1998, 393: 49-52.

Thess et al., "Crystalline Ropes of Metallic Carbon Nanotubes," *Science*, 1996, 273:483-487.

Tiefenauer et al., "Towards Amperometric Immunosensor Devices", *Biosensors and Bioelectronics*, 1997, 12: 213-223.

Tong, L., et al., "Subwavelength-diameter silica wires for low-loss optical wave guiding," *Nature*, vol. 426, No. 18, pp. 816-819 (2003).

Urban, J. J., et al., "Single-Crystalline Barium Titanate Nanowires," *Adv. Mater.*, vol. 15, No. 5, pp. 423-426 (2003).

Vossmeyer, T., et al., "Combinatorial approaches toward patterning nanocrystals," *J. Applied Physics*, vol. 84, No. 7, pp. 3664-3670 (1998).

Wang et al., "Highly polarized photoluminescence and photodetection from single indium phosphide nanowires", *Science*, 2001, 293:1455-1457.

Wang, D., et al., "Rational Growth of Branched and Hyperbranched Nanowire Structures," *Nano Letters*, vol. 4, No. 5, pp. 871-874 (2004).

Wang et al., "$SiO_2$-enhanced synthesis of Si nanowires by laser ablation," *App. Physics Letters*, 1998, 73(26):3902-3904.

Wang, W. U., et al., "Label-free detection of small-molecule-protein interactions by using nanowire nanosensors," *PNAS*, vol. 102, No. 9, pp. 3208-3212 (2005).

Wei et al., "Synthesis of Single Crystal Bismuth-Telluride and Lead-Telluride Nanowires for New Thermoelectric Materials," *Mat. Res. Soc. Symp. Proc.*, 2000, 581: 219-223.

Whang, D., et al., "Large-Scale Hierarchical Organization of Nanowire Arrays for Integrated Nanysystems," *Nano Letters*, vol. 3, No. 9, pp. 1255-1259 (2003).

Whang, D., et al., "Nanolithography Using Hierarchically Assembled Nanowire Masks," *Nano Letters*, vol. 3, No. 7, pp. 951-954 (2003).

Wolf et al., "Silicon Processing for the VLSI Era," Lattice Press, VI, 2000, 1:12-13.

Wong et al., "Covalently functionalized nanotubes as nanometre-sized probes in chemistry and biology," *Nature*, 1998, 394:52-55.

Wu, et al, "Germanium/carbon core-sheath nanostructures," *App. Phys. Lett.*, vol. 77, No. 1, pp. 43-45 (2000).

Wu et al., "Block-by-Block Growth of Single-Crystalline Si/SiGe Superlattice Nanowires," *Nano Letters*, 2002, 2(2): 83-86.

Wu, Y., et al., "Controlled Growth and Structures of Molecular-Scale Silicon Nanowires," *Nano Letters*, vol. 4, No. 3, pp. 433-436 (2004).

Wu, Y., et al., "Single-crystal metallic nanowires and metal/semiconductor nanowire heterostructures," *Nature*, vol. 430, pp. 61-64, (2004).

Xiang, J., et al., "Ge/Si nanowire heterostructures as high-performance field-effect transistors," *Nature*, vol. 441, No. 25, pp. 489-493 (2006).

Yamada, "Analysis of submicron carbon nanotube field-effect transistors," *Appl. Phys. Letters*, 2000, 76: 628-630.

Yang et al., "Controlled Growth of ZnO Nanowires and Their Optical Properties," *Adv. Funct. Mater*, 2002, 12(5): 323-331.

Yang, et al., "Wires on water," *Nature*, vol. 425, pp. 243-244 (2003).

Yu et al, "Nanoscale silicon wires synthesized using simple physical evaporation," *Appl. Phys. Letters*, 1998, 72:3458-3460.

Yu, et al., "One-Dimensional silicon nanostructures fabricated by thermal evaporation," *Materials Science & Engineering*, vol. 26, pp. 800-804 (2006).

Yun et al., "Ferroelectric Properties of Individual Barium Titanate Nanowires Investigated by Scanned Probe Microscopy," Nano-Lett, 2:447-450, 2002.

Zhang, Y.F., et al., "Bulk-quantity Si nanowires synthesized by SiO sublimation," *Journal of Crystal Growth*, vol. 212, pp. 115-118 (2000).

Zheng, G., et al., "Multiplexed electrical detection of cancer markers with nanowire sensor arrays," *Nature Biotechnology*, vol. 23, No. 10, pp. 1294-1301 (2005).

Zheng, G., et al., "Synthesis and Fabrication of High-Performance n-Type Silicon Nanowire Transistors," *Adv. Mater.*, vol. 16, No. 21, pp. 1890-1893 (2004).

Zhong et al., "Nanowire Crossbar Arrays as Address Decoders for Integrated Nanosystems," *Science*, 2003, 302:1377-1379.

Zhong, et al., "Coherent Single Charge Transport in Molecular-Scale Silicon Nanowires," *Nano Letters*, vol. 5, No. 6, pp. 1143-1146 (2005).

Zhong, Z., et al., "Synthesis of p-Type Gallium Nitride Nanowires for Electric and Photonic Nanodevices," vol. 3, No. 3, pp. 343-346 (2003).

Zhou et al., "Growth morphology and micro-structural aspects of Si nanowires synthesized by laser ablation," *J. of Crystal Growth*, 1999, 197:129-135.

Office Action from U.S. Appl. No. 09/935,776 dated Sep. 2, 2003.
Office Action from U.S. Appl. No. 09/935,776 dated Sep. 9, 2004.
Office Action from U.S. Appl. No. 09/935,776 dated Mar. 11, 2005.
Office Action from U.S. Appl. No. 09/935,776 dated Aug. 30, 2005.
Office Action from U.S. Appl. No. 09/935,776 dated May 16, 2006.
Office Action from U.S. Appl. No. 11/082,372 dated Aug. 7, 2006.
Office Action from U.S. Appl. No. 11/543,352 dated Sep. 12, 2008.
Office Action from U.S. Appl. No. 11/543,337 dated Mar. 18, 2008.
Office Action from U.S. Appl. No. 11/543,746 dated Sep. 8, 2008.
Office Action from U.S. Appl. No. 11/543,336 dated Jun. 18, 2008.
Office Action from U.S. Appl. No. 11/543,353 dated Oct. 6, 2008.
Office Action from U.S. Appl. No. 11/543,326 dated Oct. 14, 2008.
Office Action from U.S. Appl. No. 11/543,326 dated Mar. 5, 2009.
Office Action from U.S. Appl. No. 10/020,004 dated Jan. 15, 2003.
Office Action from U.S. Appl. No. 10/020,004 dated Jun. 25, 2004.
Office Action from U.S. Appl. No. 10/020,004 dated Mar. 14, 2005.
Office Action from U.S. Appl. No. 10/020,004 dated Aug. 30, 2005.
Office Action from U.S. Appl. No. 11/012,549 dated Dec. 20, 2006.
Office Action from U.S. Appl. No. 11/582,167 dated Apr. 23, 2007.
Office Action from U.S. Appl. No. 12/038,794 dated Mar. 6, 2009.
Office Action from U.S. Appl. No. 10/196,337 dated Jun. 30, 2004.
Office Action from U.S. Appl. No. 10/196,337 dated Jan. 3, 2005.
Office Action from U.S. Appl. No. 10/196,337 dated May 25, 2005.
Office Action from U.S. Appl. No. 10/196,337 dated Feb. 23, 2006.
Office Action from U.S. Appl. No. 10/196,337 dated Nov. 2, 2006.
Office Action from U.S. Appl. No. 11/172,408 dated Dec. 29, 2008.
Office Action from U.S. Appl. No. 10/995,075 dated Nov. 29, 2005.
Office Action from U.S. Appl. No. 10/734,086 dated Apr. 7, 2006.
Office Action from U.S. Appl. No. 10/734,086 dated Oct. 27, 2006.
Office Action from U.S. Appl. No. 11/501,466 dated Feb. 5, 2009.
Search Report from PCT application No. PCT/US01/48230.
International Preliminary Examination Report from PCT application PCT/US01/48230.

Written Opinion from PCT application No. PCT/US01/48230.
Search Report from PCT application No. PCT/US02/16133.
Search Report from PCT application No. PCT/US03/22061.
Search Report from PCT application No. PCT/US03/22753.
Search Report from PCT application No. PCT/US05/004459.
Written Opinion from PCT application No. PCT/US05/004459.
Search Report from PCT application No. PCT/US05/020974.
Written Opinion from PCT application No. PCT/US05/020974.
International Preliminary Examination Report from PCT application PCT/US05/020974.
Search Report from PCT application No. PCT/US05/026759.
Written Opinion from PCT application No. PCT/US05/026759.
Search Report from PCT application No. PCT/US05/034345.
Written Opinion from PCT application No. PCT/US05/034345.
Search Report from PCT application No. PCT/US07/008540.
Written Opinion from PCT application No. PCT/US07/008540.
Search Report from PCT application No. PCT/US07/013700.
Written Opinion from PCT application No. PCT/US07/013700.
Search Report from PCT application No. PCT/US07/019669.
Written Opinion from PCT application No. PCT/US07/019669.
Search Report from PCT application No. PCT/US07/024222.
Written Opinion from PCT application No. PCT/US07/024222.
Search Report from PCT application No. PCT/US07/024126.
Written Opinion from PCT application No. PCT/US07/024126.

* cited by examiner

BRANCHED NANOSCALE WIRES

RELATED APPLICATIONS

This application is a national stage filing under 35 U.S.C. §371 of International PCT Patent Application No. PCT/US2007/019669, filed Sep. 11, 2007, which claims the benefit of U.S. Provisional Patent Application Ser. No. 60/843,681, filed Sep. 11, 2006, entitled "Branched Nanoscale Wires," by Lieber, et al., incorporated herein by reference.

GOVERNMENT FUNDING

Various aspects of the present invention were made with government support under Grant Nos. FA9550-06-1-0062, FA9550-05-1-0444, and FA8650-06-C-7618 awarded by the U.S. Air Force. The U.S. Government has certain rights in the invention.

FIELD OF INVENTION

The present invention generally relates to nanotechnology and, in particular, to branched nanoscale wires, as well as associated methods and devices. Articles and devices of size greater than the nanoscale are also included.

BACKGROUND

Interest in nanotechnology, in particular sub-microelectronic technologies such as semiconductor quantum dots and nanowires, has been motivated by the challenges of chemistry and physics at the nanoscale, and by the prospect of utilizing these structures in electronic and related devices. Nanoscopic articles might be well-suited for transport of charge carriers and excitons (e.g. electrons, electron pairs, etc.) and thus may be useful as building blocks in nanoscale electronics applications. Nanowires are well-suited for efficient transport of charge carriers and excitons, and thus are expected to be important building blocks for nanoscale electronics and optoelectronics.

SUMMARY OF THE INVENTION

The present invention generally relates to nanotechnology and, in particular, to branched nanoscale wires, as well as associated methods and devices. The subject matter of the present invention involves, in some cases, interrelated products, alternative solutions to a particular problem, and/or a plurality of different uses of one or more systems and/or articles.

In one aspect, the invention is a method. According to a first set of embodiments, the method is a method of producing a branched nanoscale wire. In one embodiment, the method includes acts of providing a semiconductor nanoscale wire, etching the nanoscale wire with an etching solution to produce an H-terminated surface, exposing the H-terminated surface to a solution comprising a metal ion, whereby the metal ion is reduced by the H-terminated surface to form at least one nanoparticle deposited on the nanoscale wire, and growing a segment from the nanoparticle, thereby producing a branched nanoscale wire. In another embodiment, the method includes acts of providing a nanoscale wire having a core and a shell surrounding at least a portion of the core, where the core comprises a semiconductor and the shell comprising a semiconductor oxide, immobilizing a positively-charged entity to the shell, exposing the immobilized positively-charged entity to at least one negatively-charged nanoparticle, thereby causing adsorption of the negatively-charged nanoparticle to the positively-charged entity, and growing a segment from the nanoparticle, thereby producing a branched nanoscale wire.

The invention, in another set of embodiments, is directed to a method of depositing a nanoparticle on a nanoscale wire, and growing a metal segment from the nanoparticle.

In one set of embodiments, the method includes acts of depositing a nanoparticle on a nanoscale wire, exposing the nanoparticle to a solution containing an ion, and causing deposition of the ion onto the nanoparticle, thereby causing growth of a segment from the nanoscale wire to form a branched nanoscale wire.

The method includes, according to another set of embodiments, acts of depositing at least one nanoparticle on a nanoscale wire, and growing at least one segment from the nanoparticle. In some cases, the segment has a composition different from the nanoscale wire.

In another aspect, the invention is an article. In one set of embodiments, the article includes a branched nanoscale wire, where at least one segment of the branched nanoscale wire comprising a core and at least one shell surrounding at least a portion of the core. In some cases, the core comprises a semiconductor and the shell comprises an oxide of the semiconductor.

The article, according to another set of embodiments, includes a branched nanoscale wire comprising a first segment having a first composition and a second segment, adjacent to the first segment, having a second composition different from the first composition.

In yet another set of embodiments, the article includes a branched nanoscale wire, where at least one branch of the branched nanoscale wire comprises a core and at least one shell surrounding at least a portion of the core. In some cases, the at least one shell has a composition different from the composition of the core.

In still another set of embodiments, the article includes a branched nanoscale wire able to emit light.

In another aspect, the present invention is directed to a method of making one or more of the embodiments described herein, for example, branched nanoscale wires. In another aspect, the present invention is directed to a method of using one or more of the embodiments described herein, for example, branched nanoscale wires.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
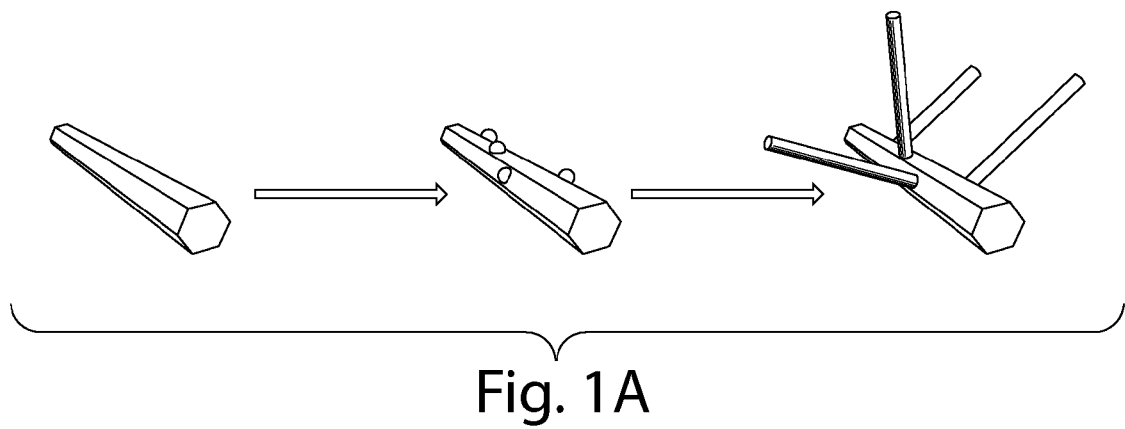
FIGS. 1A-1J shows the synthesis of branched nanoscale wires, in one embodiment of the invention.

The present invention generally relates to nanotechnology and, in particular, to branched nanoscale wires. In some cases, the branched nanoscale wires may be produced using vapor-phase and/or solution-phase synthesis. In one set of embodiments, branched nanoscale wires may be grown by depositing nanoparticles onto a nanoscale wire, and segments or "branches" can then be grown from the nanoparticles. The nanoscale wire may be any nanoscale wire, for example, a semiconductor nanoscale wire, a nanoscale wire having a core and a shell, etc. The segments may be of the same, or of different materials, than the nanoscale wire, for example, semiconductor/metal, semiconductor/semiconductor (i.e., having different compositions, for instance, IV-IV, IV-III/V, IV-II/VI, etc.), etc. The junction between the segment and the nanoscale wire, in some cases, is epitaxial. In one embodiment, the nanoparticles are adsorbed onto the nanoscale wire by immobilizing a positively-charged entity, such as polylysine, to the nanoscale wire, and exposing it to the nanoparticles. In another embodiment, nanoparticles are deposited onto a nanoscale wire by etching the nanoscale wire to produce an H-terminated surface, then exposing the surface to a solution comprising a metal ion, which can be reduced by the surface to form nanoparticles. Segments or branches can then be grown from the deposited nanoparticles to form the branched nanoscale wire. Other aspects of the invention include assays, sensors, kits, and/or other devices that include such nanoscale wires, methods of making and/or using such nanoscale wires, or the like.

One set of embodiments is directed to methods of producing a branched nanoscale wire. Nanoparticles, such as gold nanoparticles, are deposited onto a nanoscale wire, and then segments or "branches" are grown from the nanoparticles. The nanoscale wire may be any nanoscale wire, for example, a semiconductor nanoscale wire, a nanoscale wire having a core and a shell, etc., as discussed below. In one embodiment, gold nanoparticles are deposited onto the nanoscale wire by etching the nanoscale wire using, for example, HF, to produce an H-terminated surface. Without wishing to be bound by any theory, it is generally believed that the H-terminated surface, in certain cases, causes the electrochemical reduction of gold ions in solution, for example, from a charged state (e.g., $Au^{2+}$ or $Au^{3+}$) to a neutral (i.e., $Au^0$) state, i.e., such that the gold ions precipitate out of solution to form nanoparticles on the surface of the H-terminated surface. The size of the deposited gold nanoparticles may be controlled, for instance, by controlling the concentration of gold in solution, and/or by controlling the deposition or exposure time. In another embodiment, nanoparticles are deposited onto a nanoscale wire by immobilizing a positively-charged entity, for example, a polymer such as polylysine, onto the surface of the nanoscale wire, then exposing the positively-charged entity to negatively-charged nanoparticles. The opposite charges are believed to cause adsorption of the nanoparticles to the surface of the nanoscale wire.

After deposition of the nanoparticles, segments of material may be grown from them. In some cases, CVD (chemical vapor deposition) or other various vapor-liquid-solid (VLS) growth techniques may be used to grow the segments, of material, for example, to produce segments comprising semiconductors such as Si, GaAs, GaP, InP, CdSe, ZnSe, CdS, ZnS, etc. In some embodiments, however, solution-phase synthesis techniques may be used. For instance, gold segments may be grown from nanoparticles by annealing the nanowire/nanoparticle composite and exposing the nanoparticles to a solution containing gold (for example, gold tetrachloride acid, $HAuCl_4$). Without wishing to be bound by any theory, it is believed that deposition of the gold is constrained due to the presence of surfactants. Surfactants such as cetyl trimethyl ammonium bromide (CTAB) may preferentially interact with the (100) and (111) facets of the gold nanoparticle, and thus, growth occurs primarily along the <110> direction, causing uniaxial elongation.

However, it should be noted that the present invention is not limited to the above-described embodiments. In general, various aspects of the present invention provide various forms of branched nanoscale wires, i.e., having at least one vertex where three or more segments of the nanoscale wire co-intersect (for instance, to form a "Y" junction, a "T" junction, an "X" junction, a "K" junction, etc.). The segments themselves, in certain embodiments, may also be further branched, e.g., forming structures such as "hyperbranched" structures. The nanoscale wires, in some cases, are nanowires, i.e., solid wires, as discussed below.

One aspect of the present invention is directed to heterobranched nanoscale wires, i.e., branched nanoscale wires having at least first segment having a first composition and a second segment having a second composition different from the first composition. Of course, higher numbers of segments and/or branches are possible. As non-limiting examples, the first segment may be a semiconductor and the second segment may be a different semiconductor, a metal such as gold, or the like.

In some embodiments, one or more of the segments comprises a semiconductor, for example, a Group IV semiconductor, a Group III-V semiconductor, a Group II-VI semiconductor, or the like. Examples include, but are not limited to, Si, GaAs, GaP, InP, CdSe, ZnSe, CdS, ZnS, etc. If more than one segment comprising a semiconductor is present, the segments may each independently be the same or different. As a non-limiting example, if one segment is Si, another segment within the branched nanoscale wire may be GaAs, GaP, InP, CdSe, ZnSe, CdS, and/or ZnS. Combinations of these and/or other semiconductors are also possible, for example, a branched nanoscale wire may have three or more types of semiconductors, such as Si/GaAs/GaP, Si/GaAs/InP, etc.

As used herein, the term "Group," with reference to the Periodic Table, is given its usual definition as understood by one of ordinary skill in the art. For instance, the Group II elements include Mg and Ca, as well as the Group II transition elements, such as Zn, Cd, and Hg. Similarly, the Group III elements include B, Al, Ga, In and Tl; the Group IV elements include C, Si, Ge, Sn, and Pb; the Group V elements include N, P, As, Sb and Bi; and the Group VI elements include O, S, Se, Te and Po. Combinations involving more than one element from each Group are also possible. For example, a Group II-VI material may include at least one element from Group II and at least one element from Group VI, e.g., ZnS, ZnSe, ZnSSe, ZnCdS, CdS, or CdSe. Similarly, a Group III-V material may include at least one element from Group III and at least one element from Group V, for example GaAs, GaP, GaAsP, InAs, InP, AlGaAs, or InAsP. Other dopants may also be included with these materials and combinations thereof, for example, transition metals such as Fe, Co, Te, Au, and the like.

In some embodiments, one or more of the segments may be a bulk-doped semiconductor. As used herein, a "bulk-doped" article (e.g. an article, or a section or region of an article) is an article for which a dopant is incorporated substantially throughout the crystalline lattice of the article, as opposed to an article in which a dopant is only incorporated in particular regions of the crystal lattice at the atomic scale, for example, only on the surface or exterior. For example, some articles such as carbon nanotubes are typically doped after the base material is grown, and thus the dopant only extends a finite distance from the surface or exterior into the interior of the crystalline lattice. It should be understood that "bulk-doped" does not define or reflect a concentration or amount of doping in a semiconductor, nor does it necessarily indicate that the doping is uniform. In particular, in some embodiments, a bulk-doped semiconductor may comprise two or more bulk-doped regions. Thus, as used herein to describe nanoscopic wires, "doped" refers to bulk-doped nanoscopic wires, and, accordingly, a "doped nanoscopic (or nanoscale) wire" is a bulk-doped nanoscopic wire. "Heavily doped" and "lightly doped" are terms the meanings of which are understood by those of ordinary skill in the art.

In some cases, one or more of the segments may comprise two or more regions having different compositions. Each region may have any shape or dimension, and these can be the same or different between regions. For example, a region may have a smallest dimension of less than 1 micron, less than 100 nm, less than 10 nm, or less than 1 nm.

The two or more regions may be longitudinally arranged relative to each other, and/or radially arranged (e.g., as in a core/shell arrangement, for example, having a core and at least one shell surrounding at least a portion of the core). As one example, the branched nanoscale wire may have multiple regions of semiconductor materials arranged radially. In another example, a branched nanoscale wire may have two regions having different compositions arranged longitudinally, surrounded by a third region or several regions, each having a composition different from that of the other regions. As a specific example, the regions may be arranged in a layered structure within the branched nanoscale wire, and one or more of the regions may (in some cases) be delta-doped or at least partially delta-doped. As another example, the branched nanoscale wire may have a series of regions positioned both longitudinally and radially relative to each other. The arrangement can include a core that differs in composition along its length (changes in composition or concentration longitudinally), while the lateral (radial) dimensions of the core do, or do not, change over the portion of the length differing in composition. The shell portions can be adjacent each other (contacting each other, or defining a change in composition or concentration of a unitary shell structure longitudinally), or can be separated from each other by, for example, air, an insulator, a fluid, or an auxiliary, non-nanoscale wire component.

Thus, as mentioned, in certain embodiments, the segment may include a core and one or more shells. The shells can be positioned directly on the core, or can be separated from the core by one or more intermediate shells portions that can themselves be constant in composition longitudinally, or varying in composition longitudinally, i.e., the invention allows the provision of any combination of a nanowire core and any number of radially-positioned shells (e.g., concentric shells), where the core and/or any shells can vary in composition and/or concentration longitudinally, any shell sections can be spaced from any other shell sections longitudinally, and different numbers of shells can be provided at different locations longitudinally along the structure. The shell may have any suitable thickness. For instance, the shell may be at least about 2 nm thick, at least about 3 nm thick, at least about 4 nm thick, at least about 5 nm thick, etc. In some cases, one or more shells may be a single monolayer of atoms (i.e., "delta-doping"). In certain cases, the shell may be less than a single monolayer thick (for example, if some of the atoms within the monolayer are absent).

In certain embodiments, as discussed in detail below, one or more of the segments may comprise a metal, for example, a noble metal such as Au or Ag. For instance, in certain cases, a segment of a branched nanoscale wire may consist essentially of gold.

Combinations of metal and/or semiconductors are also possible, for example, a branched nanoscale wire having Si/GaAs/Au segments, Si/InP/Au segments, etc. In some cases, the branched nanoscale wire will also have one or more oxide regions or layers, which may be arranged as a shell around a core of a nanowire in some cases. For example, a segment of the branched nanoscale wire may have a semiconductor core (for example, Si) and a semiconductor oxide shell (for example, $SiO_2$).

Many nanoscale wires as used in accordance with the present invention are individual nanoscale wires. As used herein, "individual nanoscale wire" means a nanoscale wire free of contact with another nanoscale wire (but not excluding contact of a type that may be desired between individual nanoscale wires, e.g., as in a crossbar array). For example, an "individual" or a "free-standing" article may, at some point in its life, not be attached to another article, for example, with another nanoscale wire, or the free-standing article may be in solution. This is in contrast to nanotubes produced primarily by laser vaporization techniques that produce materials formed as ropes having diameters of about 2 nm to about 50 nm or more and containing many individual nanotubes. This is also in contrast to conductive portions of articles which differ from surrounding material only by having been altered chemically or physically, in situ, i.e., where a portion of a uniform article is made different from its surroundings by selective doping, etching, etc. An "individual" or a "free-standing" article is one that can be (but need not be) removed from the location where it is made, as an individual article, and transported to a different location and combined with different components to make a functional device such as those described herein and those that would be contemplated by those of ordinary skill in the art upon reading this disclosure.

In another set of embodiments, the nanoscale wire may include additional materials, such as semiconductor materials, dopants, organic compounds, inorganic compounds, etc. The following are non-limiting examples of materials that may be used as dopants within the nanoscale wire. The dopant may be an elemental semiconductor, for example, silicon, germanium, tin, selenium, tellurium, boron, diamond, or phosphorous. The dopant may also be a solid solution of various elemental semiconductors. Examples include a mixture of boron and carbon, a mixture of boron and $P(BP_6)$, a mixture of boron and silicon, a mixture of silicon and carbon, a mixture of silicon and germanium, a mixture of silicon and tin, a mixture of germanium and tin, etc. In some embodiments, the dopant may include mixtures of Group IV elements, for example, a mixture of silicon and carbon, or a mixture of silicon and germanium. In other embodiments, the dopant may include mixtures of Group III and Group V elements, for example, BN, BP, BAs, AlN, AlP, AlAs, AlSb, GaN, Ge, GaAs, GaSb, InN, InP, InAs, or InSb. Mixtures of these combinations may also be used, for example, a mixture of BN/BP/BAs, or BN/AlP. In other embodiments, the dopants may include mixtures of Group III and Group V elements. For example, the mixtures may include AlGaN, GaPAs, InPAs, GaInN, AlGaInN, GaInAsP, or the like. In other embodiments, the dopants may also include mixtures of Group II and Group VI elements. For example, the dopant may include mixtures of ZnO, ZnS, ZnSe, ZnTe, CdS, CdSe, CdTe, HgS, HgSe, HgTe, BeS, BeSe, BeTe, MgS, MgSe, or the like. Alloys or mixtures of these dopants are also be possible, for example, ZnCd Se, or ZnSSe or the like. Additionally, mixtures of different groups of semiconductors may also be possible, for example, combinations of Group II-Group VI and Group III-Group V elements, such as $(GaAs)_x (ZnS)_{1-x}$. Other non-limiting examples of dopants may include mixtures of Group IV and Group VI elements, for example GeS, GeSe, GeTe, SnS, SnSe, SnTe, PbO, PbS, PbSe, PbTe, etc. Other dopant mixtures may include mixtures of Group I elements and Group VII elements, such as CuF, CuCl, CuBr, CuI, AgF, AgCl, AgBr, AgI, or the like. Other dopant mixtures may include different mixtures of these elements, such as $BeSiN_2$, $CaCN_2$, $ZnGeP_2$, $CdSnAs_2$, $ZnSnSb_2$, $CuGeP_3$, $CuSi_2P_3$, $Si_3N_4$, $Ge_3N_4$, $Al_2O_3$, $(Al, Ga, In)_2(S, Se, Te)_3$, $Al_2CO$, $(Cu, Ag)(Al, Ga, In, Tl, Fe)(S, Se, Te)_2$ or the like. As a non-limiting example, a p-type dopant may be selected from Group III, and an n-type dopant may be selected from Group V. For instance, a p-type dopant may include at least one of B, Al, and In, and an n-type dopant may include at least one of P, As, and Sb. For Group III-Group V mixtures, a p-type dopant may be selected from Group II, including one or more of Mg, Zn, Cd and Hg, or Group IV, including one or more of C and Si. An n-type dopant may be selected from at least one of Si, Ge, Sn, S, Se and Te. It will be understood that the invention is not limited to these dopants, but may include other elements, alloys, or mixtures as well.

Another aspect of the present invention is generally directed to methods of producing a branched nanoscale wire. For example, one or more nanoparticles may be deposited onto a nanoscale wire (as discussed in detail below), and then at least one segment grown from the nanoparticle to produce a branched nanoscale wire. As discussed, the segment may have a composition that is the same or different from the nanoscale wire. This process may also be repeated to produce different segments having different compositions, for example, to produce a hyperbranched structure.

In one set of embodiments, one or more nanoparticles may be deposited onto a nanoscale wire by producing a charge on the nanoscale wire, and exposing the charged nanoscale wire to at least one nanoparticle having an opposite charge to the charged nanoscale wire. The nanoscale wire may be any nanoscale wire, for example, a semiconductor nanoscale wire, a nanoscale wire having a core and a shell, a branched nanoscale wire (e.g., produced as described herein), etc. The charge on the nanoscale wire may be produced, for instance, electrically, by immobilizing a charged entity to the nanoscale wire, etc. As a non-limiting example, if metal nanoparticles such as gold nanoparticles are used, which often have a negative charge, then a positively-charged entity may first be immobilized to the nanoscale wire. The positively-charged entity can be, for instance, a positively-charged polymer such as polylysine, poly(ethyleneimine), or poly(allylamine hydrochloride). The nanoparticles can then be attracted to the positively-charged entity and thereby become adsorbed onto the nanoscale wire. As discussed below, segments can then be grown from the nanoparticles to produce a branched nanoscale wire.

In another set of embodiments, a surface of the nanoscale wire is treated to produce a reducing surface, i.e., a surface that can reduce a positive ion, and the reducing surface is then exposed to an ionic solution, whereby an ion in solution can be reduced by the reducing surface. If the ions are reduced to a 0 state, the ions may precipitate out of solution, e.g., forming nanoparticles on the reducing surface of the nanoscale wire. The reducing surface can be prepared, for example, by etching the nanoscale wire with an etching solution. An example of an etching solution is HF, which causes the surface to become H-terminated. Other examples include $NH_4F$ or $NH_4F$/HF. Exposure of the H-terminated surface to positively-charged metal ions in solution can cause the reduction of the metal ions ultimately to a zero charge, which may thus cause precipitation of the metal ions from solution, e.g., to form nanoparticles. Typically, the metal is more electronegative than hydrogen. As an example, gold ions in solution (e.g., $Au^{3+}$ or $Au^{2+}$) can become reduced to $Au^0$ to form gold nanoparticles. A non-limiting example of a solution containing gold ions is gold tetrachloride acid, $HAuCl_4$. As another example, silver ions in solution (e.g., $Ag^+$) can become reduced to $Ag^0$ to form silver nanoparticles. A non-limiting example of a solution containing silver ions is $AgNO_3$. Further non-limiting examples of suitable metals include Pd, Pt, or Cu. The size and/or density of the deposited nanoparticles may be controlled by, e.g., the concentration of metal ions in solution, and/or the exposure time.

Next, additional segments (e.g., comprising a semiconductor and/or a metal) can then be grown from the nanoparticles to produce a branched nanoscale wire. In one set of embodiments, semiconductor segments can be grown from the nanoparticles using conventional techniques such as CVD (chemical vapor deposition) or other various vapor-liquid-solid (VLS) growth techniques. See, e.g., Wang, et al., "Rational Growth of Branched and Hyperbranched Nanowire Structures," *Nano Lett.*, 4(5):871-874 (2004), which discusses growth of branched nanowire structures produced using vapor-liquid-solid (VLS) growth techniques. See also U.S. patent application Ser. No. 09/935,776, filed Aug. 22, 2001, entitled "Doped Elongated Semiconductors, Growing Such Semiconductors, Devices Including Such Semiconductors, and Fabricating Such Devices," by Lieber, et at, published as U.S. Patent Application Publication No. 2002/0130311 on Sep. 19, 2002, or U.S. patent application Ser. No. 10/196,337, filed Jul. 16, 2002, entitled "Nanoscale Wires and Related Devices," by Lieber, et al., published as U.S. Patent Application Publication No. 2003/0089899 on May 15, 2003, each incorporated herein by reference.

For instance, certain arrangements may utilize metal-catalyzed CVD techniques ("chemical vapor deposition") to synthesize segments. CVD synthetic procedures can readily be carried out by those of ordinary skill in the art. The segments may also be grown through laser catalytic growth. If uniform diameter nanoparticles (less than 10% to 20% variation depending on how uniform the nanoparticles are) are used as the catalytic cluster, segments with uniform size (diameter) distribution can be produced, where the diameter of the segments is determined by the size of the nanoparticles. By controlling growth time, segments with different lengths can be grown.

One technique that may be used to grow the segments is catalytic chemical vapor deposition ("C-CVD"). In C-CVD, reactant molecules are formed from the vapor phase. Nanoscale wires may be doped by introducing the doping element into the vapor phase reactant (e.g. diborane and phosphane). The doping concentration may be controlled by controlling the relative amount of the doping compound introduced in the composite target. The final doping concentration or ratios are not necessarily the same as the vapor-phase concentration or ratios. By controlling growth conditions, such as temperature, pressure or the like, segments having the same doping concentration may be produced.

Other techniques to produce segments are also contemplated. For example, nanoscale wires of any of a variety of materials may be grown directly from vapor phase through a vapor-solid process.

In some cases, the segment may be doped after formation, for instance, doped post-synthetically with various dopants. Such doping may occur throughout the entire nanoscale wire, or in one or more portions of the nanoscale wire, for example, in a wire having multiple regions differing in composition.

In yet another set of embodiments, metal segments can be grown in a solution-phase synthesis technique from the nanoparticles, by exposing the nanoparticles to a solution containing a metal ion. The metal ion may be the same or different than the metal in the nanoparticles. For certain types of nanoparticles, deposition of the metal ions on the nanoparticle can be constrained due to the presence of surfactants or other species that preferentially interact with certain faces of the nanoparticle, and thus, growth in certain directions may be preferred. For instance, if the nanoparticle is gold, deposition of gold onto the nanoparticle may be constrained and growth along the <110> axis of the deposited gold nanoparticle may be preferred, leading to uniaxial elongation. As a specific non-limiting example, a surfactant such as cetyl trimethyl ammonium bromide (CTAB) may preferentially interact with the {100} and {111} facets of a gold nanoparticle, causing growth to occur primarily along the <110> axis. The diameter and/or the aspect ratio may be controlled by controlling, for example, the concentration of metal ion in solution, and/or the acidity or pH, i.e., the hydrogen ion concentration. Examples of metals that can be used include, but are not limited to, noble metals such as gold, silver, copper, palladium, or platinum.

Other aspects of the invention are directed to various uses of the above-described branched nanoscale wires, for example, in electronic devices, photonic devices, etc. For instance, a hetero-branched nanoscale wire may find use in any device where a heterojunction is desired, for instance, a transistor such as a field effect transistors, a diode such as a light emitting diode, a logic gate (e.g., AND, OR, NOR, etc.), a sensor, or the like. Other examples of such devices include, but are not limited to, bipolar junction transistors (BJTs), tunnel diodes, modulation doped superlattices, complementary inverters, light sensing devices, thermal or temperature detectors, Josephine junctions, photodetectors, inverters, latches, flip-flops, registers, switches, and the like. Furthermore, junctions having large dielectric contrasts between the two regions may be used to produce 1D waveguides with built-in photonic band gaps, or cavities for nanowire lasers. In some embodiments, the nanoscale wires of the present invention may be manufactured during the device fabrication process. In other embodiments, the nanoscale wires of the present inventions may first be synthesized, then assembled in a device. Thus, certain embodiments of the present invention includes the ability to fabricate essentially any electronic device that can benefit from adjacent semiconducting components.

In one set of embodiments, the invention includes a nanoscale inverter. Any nanoscale inverter may be contemplated that is constructed using adjacent regions having different compositions, e.g., within the branched nanoscale wire.

In another set of embodiments, the invention includes a nanoscale diode. Any nanoscale diode may be contemplated that is constructed using adjacent regions having different compositions, for example, Zener diodes, tunnel diodes, light-emitting diodes, and the like. A tunnel diode may be arranged similarly or exactly the same as a complementary inverter.

In yet another set of embodiments, the invention comprises a nanoscale transistor, such as a field effect transistor ("FET") or a bipolar junction transistor ("BJT"). Any transistor constructed using adjacent regions having different compositions may be contemplated.

Light-emission sources are provided in accordance with the invention as well, in which electrons and holes may combine to emit light. One embodiment of a light-emission source of the invention includes at least one heterojunction. At the size scale of the invention (nanoscale) the wavelength of light emission may be controlled by controlling the size or diameter of the heterojunction. For example, where nanowires are used, a nanowire with a larger smallest dimension will provide emission at a lower frequency. At the size scales of the present invention, the wavelength of emission may be controlled to emit at wavelengths shorter than 920 rim, for example between 920 and 580 nm. Wavelengths can be selected within this range, such as 900, 850, 800, 750, 700 nm, etc., depending upon the wire size.

As used herein, the term "light" generally refers to electromagnetic radiation, having any suitable wavelength (or equivalently, frequency). For instance, in some embodiments, the light may include wavelengths in the optical or visual range (for example, having a wavelength of between about 400 nm and about 700 nm), infrared wavelengths (for example, having a wavelength of between about 300 micrometers and 700 nm), ultraviolet wavelengths (for example, having a wavelength of between about 400 nm and about 10 nm), or the like. The light may have a single wavelength, or include a plurality of different wavelengths. In some cases, the light may be monochromatic or substantially monochromatic (i.e., having a single wavelength or a narrow wavelength distribution). The monochromatic beam of light may have a narrow distribution of wavelengths. For example, at least about 90%, at least about 95%, at least about 97%, or at least about 99% of the wavelengths comprising the light may be within 5 nm or 3 nm of the average wavelength of the light.

In another set of embodiments, the present invention generally relates to the attachment of reaction entities, such as biological entities, to the surfaces of nanoscale wires, in some cases by using covalent bonding. The entity is thus immobilized with respect to the surface of the nanoscale wire. In some embodiments, a linker is used to covalently immobilize the entity with respect to the nanoscale wire. In some cases, the entity may be covalently immobilized with respect to the surface of the nanoscale wire at relatively short distances, depending on the size of the linker and/or the precursors thereof. For instance, the entity may be immobilized at a distance of less than about 20 nm, less than about 15 nm, less than about 10 nm, less than about 9 nm, less than about 8 nm, less than about 7 nm, less than about 6 nm, less than about 5 nm, less than about 4 nm, less than about 3 nm, less than about 2 nm, or less than about 1 nm from the surface of the nanoscale wire. In some cases, the proximity of the entity may control or otherwise affect electronic and/or other properties of the nanoscale wire, for example, the conductivity of the nanoscale wire.

Non-limiting examples of chemistries suitable for attaching entities to surfaces of nanoscale wires, optionally via one or more linkers, include the following. In one set of embodiments of the present invention, the surface of the nanoscale wire may be functionalized, for example, the surface may be functionalized with aldehydes, amines, thiols, or the like, which may form nitrogen-containing or sulfur-containing covalent bonds. For instance, in some embodiments, the reaction entity may be covalently bound to the nanoscale wire through the use of a moiety such as an aldehyde moiety, an amine moiety, and/or a thiol moiety. In certain embodiments, a nanoscale wire may be reacted with an aldehyde, amine, or a thiol in solution to functionalize the nanoscale wire with the appropriate moiety, e.g., such that the surface of the nanoscale wire includes terminal aldehyde, amine, and/or thiol groups. Additional examples are disclosed in U.S. patent application Ser. No. 11/501,466, filed Aug. 9, 2006, entitled "Nanoscale Sensors," by Lieber, et al., incorporated herein by reference.

One or more entities, e.g., reaction entities such as proteins, enzymes, nucleic acids, antibodies, receptors, ligands, etc., may then be reacted with the aldehyde, amine, and/or thiol moieties to covalently bind the entity to the nanoscale wire. In some cases, after the entity has been fastened to the nanoscale wire, the surface of the nanoscale wire, including any unreacted moieties, is then passivated, e.g., blocked with one or more compounds that causes the moieties to become unreactive. Non-limiting examples of such passivating agents include ethanolamine. For example, a solution may be added to the nanowires that includes one or more passivating agents.

Also provided, according to another set of embodiments of the present invention, is a sensing element comprising a nanoscale wire and a detector constructed and arranged to determine a property and/or a change in a property of the nanoscale wire. In some cases, alteration of a property of the nanoscale wire may be indicative of an interaction between a reaction entity and an analyte (e.g., association or dissociation of the reaction entity and the analyte). Where a detector is present, any detector capable of determining a property associated with the nanoscale wire can be used. The property can be electronic, electromagnetic, optical, mechanical, or the like. Examples of electrical or magnetic properties that can be determined include, but are not limited to, voltage, current, conductivity, resistance, impedance, inductance, charge, etc. Examples of optical properties associated with the nanoscale wire include its emission intensity and/or emission wavelength, e.g. where the nanoscale wire is emissive. In some cases, the detector will include a power source and a metering device, for example a voltmeter or an ammeter.

In one embodiment, a conductance (or a change in conductance) less than about 1 nS in a nanoscale wire sensor of the invention can be detected. In another embodiment, a conductance in the range of thousandths of a nS can be detected. In other embodiments, conductances of less than about 10 microsiemens, less than about 1 microsiemen, less than about 100 nS, or less than about 10 nS can be detected. The concentration of a species, or analyte, may be detected from femtomolar concentrations, to nanomolar, micromolar, millimolar, and to molar concentrations and above. By using nanoscale wires with known detectors, sensitivity can be extended to a single molecules in some cases.

As a non-limiting example, a charged analyte may be determined by determining a change in an electrical property of the nanoscale wire, for example, conductivity. Immobilizing a charged analyte relative to the nanoscale wire may cause a change in the conductivity of the nanoscale wire, and in some cases, the distance between the charged analyte and the nanoscale wire may determine the magnitude of the change in conductivity of the nanoscale wire. Uncharged analytes can be similarly determined, for instance, by causing the analyte to become charged, e.g., by altering environmental conditions such as pH (by raising or lowering pH), temperature, reactants, or the like, by reacting the analyte with a charged moiety, or the like.

The analyte to be determined by the nanoscale sensor may be present within a sample. The term "sample" refers to any cell, lysate, tissue, or fluid from a biological source (a "biological sample"), or any other medium, biological or non-biological, that can be evaluated in accordance with the invention. The sample may be, for instance, a liquid (e.g., a solution or a suspension) or a gas. A sample includes, but is not limited to, a biological sample drawn from an organism (e.g. a human, a non-human mammal, an invertebrate, a plant, a fungus, an algae, a bacteria, a virus, etc.), a sample drawn from food designed for human consumption, a sample including food designed for animal consumption such as livestock feed, milk, an organ donation sample, a sample of blood destined for a blood supply, a sample from a water supply, a soil sample, or the like.

In some cases, the sample may be a sample suspected of containing an analyte. A "sample suspected of containing" a particular component means a sample with respect to which the content of the component is unknown. For example, a fluid sample from a human suspected of having a disease, but not known to have the disease, defines a sample suspected of containing the disease. "Sample" in this context includes naturally-occurring samples, such as physiological samples from humans or other animals, samples from food, livestock feed, water, soil, etc. Typical samples include tissue biopsies, cells, cell lysates, whole blood, serum or other blood fractions, urine, ocular fluid, saliva, fluid or other samples from tonsils, lymph nodes, needle biopsies, etc.

A variety of sample sizes, for exposure of a sample to a nanoscale sensor of the invention, can be used in various embodiments. As examples, the sample size used in nanoscale sensors may be less than or equal to about 10 microliters, less than or equal to about 1 microliter, or less than or equal to about 0.1 microliter. The sample size may be as small as about 10 nanoliters, 1 nanoliter, or less, in certain instances. The nanoscale sensor also allows for unique accessibility to biological species and may be used for in vivo and/or in vitro applications. When used in vivo, in some case, the nanoscale sensor and corresponding method result in a minimally invasive procedure.

The invention, in some embodiments, involves a sensing element comprising a sample exposure region and a nanoscale wire able to detect the presence or absence of an analyte, and/or the concentration of the analyte. The "sample exposure region" may be any region in close proximity to the nanoscale wire where a sample in the sample exposure region addresses at least a portion of the nanoscale wire. Examples of sample exposure regions include, but are not limited to, a well, a channel, a microfluidic channel, or a gel. In certain embodiments, the sample exposure region is able to hold a sample proximate the nanoscale wire, and/or may direct a sample toward the nanoscale wire for determination of an analyte in the sample. The nanoscale wire may be positioned adjacent or within the sample exposure region. Alternatively, the nanoscale wire may be a probe that is inserted into a fluid or fluid flow path. The nanoscale wire probe may also comprise, in some instances, a microneedle that supports and/or is integral with the nanoscale wire, and the sample exposure region may be addressable by the microneedle. In this arrangement, a device that is constructed and arranged for insertion of a microneedle probe into a sample can include a region surrounding or otherwise in contact with the microneedle that defines the sample exposure region, and a sample in the sample exposure region is addressable by the nanoscale wire, and vice versa. Fluid flow channels can be created at a size and scale advantageous for use in the invention (microchannels) using a variety of techniques such as those described in International Patent Application Serial No. PCT/US97/04005, entitled "Method of Forming Articles and Patterning Surfaces via Capillary Micromolding," filed Mar. 14, 1997, published as Publication No. WO 97/33737 on Sep. 18, 1997, and incorporated herein by reference.

As an example, a sample, such as a fluid suspected of containing an analyte that is to be determined, may be presented to a sample exposure region of a sensing element comprising a nanoscale wire. An analyte present in the fluid that is able to bind to the nanoscale wire and/or a reaction entity immobilized relative to the nanoscale wire may cause a change in a property of the nanoscale wire that is determinable upon binding, e.g. using conventional electronics. If the analyte is not present in the fluid, the relevant property of the nanoscale wire will remain unchanged, and the detector will measure no significant change. Thus, according to this particular example, the presence or absence of an analyte can be determined by monitoring changes, or lack thereof, in the property of the nanoscale wire. In some cases, if the detector measures a change, the magnitude of the change may be a function of the concentration of the analyte, and/or a function of some other relevant property of the analyte (e.g., charge or size, etc.). Thus, by determining the change in the property of the nanoscale wire, the concentration or other property of the analyte in the sample may be determined.

In some embodiments, one or more nanoscale wires may be positioned in a channel or in a microfluidic channel, which may define the sample exposure region in some cases. As used herein, a "channel" is a conduit that is able to transport one or more fluids specifically from one location to another. Materials may flow through the channels, continuously, randomly, intermittently, etc. The channel may be a closed channel, or a channel that is open, for example, open to the external environment. The channel can include characteristics that facilitate control over fluid transport, e.g., structural characteristics, physical/chemical characteristics (e.g., hydrophobicity vs. hydrophilicity) and/or other characteristics that can exert a force (e.g., a containing force) on a fluid when within the channel. The fluid within the channel may partially or completely fill the channel. In some cases the fluid may be held or confined within the channel or a portion of the channel in some fashion, for example, using surface tension (i.e., such that the fluid is held within the channel within a meniscus, such as a concave or convex meniscus). The channel may have any suitable cross-sectional shape that allows for fluid transport, for example, a square channel, a circular channel, a rounded channel, a rectangular channel (e.g., having any aspect ratio), a triangular channel, an irregular channel, etc. The channel may be of any size. For example, the channel may have a largest dimension perpendicular to a direction of fluid flow within the channel of less than about 1000 micrometers in some cases (i.e., a microfluidic channel), less than about 500 micrometers in other cases, less than about 400 micrometers in other cases, less than about 300 micrometers in other cases, less than about 200 micrometers in still other cases, less than about 100 micrometers in still other cases, or less than about 50 or 25 micrometers in still other cases. In some embodiments, the dimensions of the channel may be chosen such that fluid is able to freely flow through the channel. The dimensions of the channel may also be chosen in certain cases, for example, to allow a certain volumetric or linear flowrate of fluid within the channel. Of course, the number of channels, the shape or geometry of the channels, and the placement of channels can be determined by those of ordinary skill in the art.

One or more different nanoscale wires may cross the same microfluidic channel (e.g., at different positions) to detect the same or different analytes, to measure a flowrate of an analyte(s), etc. In another embodiment, one or more nanoscale wires may be positioned in a microfluidic channel to form one of a plurality of analytic elements, for instance, in a microneedle probe, a dip and read probe, etc. The analytic elements probe may be implantable and capable of detecting several analytes simultaneously in real time, according to certain embodiments. In another embodiment, one or more nanoscale wires may be positioned in a microfluidic channel to form an analytic element in a microarray for a cassette or a lab-on-a-chip device. Those of ordinary skill in the art would know of examples of cassette or lab-on-a-chip devices that are suitable for high-throughout chemical analysis and screening, combinational drug discovery, etc. The ability to include multiple nanoscale wires in one nanoscale sensor also allows, in some cases, for the simultaneous detection of different analytes suspected of being present in a single sample, i.e., the nanoscale sensor allows "multiplexed" detection of different analytes. For example, a nanoscale sensor may include a plurality of nanoscale wires that each detect different pH levels, proteins, enzymes, toxins, small molecules, and/or nucleic acids, etc.

In some cases, the sensing element may comprise a plurality of nanoscale wires able to determine (i.e., detect the presence, absence, and/or amount or concentration) one or more analytes within a sample, for example, from a liquid or solution, blood serum, etc., as previously described. Various nanoscale wires within the sensing element may be differentially doped as described herein, and/or contain different reaction entities, and/or the same reaction entities at different concentrations, thereby varying the sensitivity of the nanoscale wires to the analytes, as needed. For example, different reaction entities may be "printed" on the nanoscale wires, e.g., using microarray printing techniques or the like, thereby producing an array of nanoscale wires comprising different reaction entities. In some cases, individual nanoscale wires may be selected based on their ability to interact with specific analytes, thereby allowing the detection of a variety of analytes. The plurality of nanoscale wires may be randomly oriented or parallel to one another, according to another set of embodiments. The plurality of nanoscale wires may also be oriented in an array on a substrate, in specific instances.

A sensing element of the present invention can collect real time data and/or near-real time data, in some embodiments. The data may be used, for example, to monitor the reaction rate of a specific chemical or biological reaction. Physiological conditions or drug concentrations present in vivo may also produce a real time (or near-real time) signal that may be used to control a drug delivery system, in another embodiment of the invention. In addition, electrical determination of one or more properties of the nanoscale wire may allow for the determination of one or more analytes as a function of time. For example, the conductance of a nanoscale wire may be determined as a function of time, which may give additional information regarding the analyte.

In some cases, the nanoscale wires, or at least a portion of the nanoscale wires, may be individually addressable, i.e., the status of the nanoscale wire may be determined without determining the status of nearby nanoscale wires. Thus, for example, a nanoscale wire within a sensing element, or a number of nanoscale wires within the sensing element, may be in electrical communication with an electrode that is able to address the nanoscale wire(s), and such a wire may be addressed using the electrode without addressing other nanoscale wires not in electrical communication with the electrode. For example, a first reaction entity immobilized relative to a first nanoscale wire may bind an analyte, and such a binding event may be detectable independently of the detection of a binding event involving a second reaction entity immobilized relative to a second nanoscale wire. The electrodes may be in electronic communication with one or more electrical contacts.

In some embodiments, the invention includes a microarray including a plurality of sensing regions, at least some of which comprise one or more nanoscale wires. The microarray, including some or all of the sensing regions, may define a sensing element in a sensor device. At least some of the nanoscale wires are able to determine an analyte suspected to be present in a sample that the sensing region of the microarray is exposed to, for example, the nanoscale wire may comprise a reaction entity able to interact with an analyte. If more than one nanoscale wire is present within the sensing region, the nanoscale wires may be able to detect the same analyte and/or different analytes, depending on the application.

In another set of embodiments, an article of the invention may comprise a cassette comprising a sensing element having a sample exposure region and a nanoscale wire. The detection of an analyte in a sample within the sample exposure region may occur, in some cases, while the cassette is disconnected to a detector apparatus, allowing samples to be gathered at one site, and determined at another. The cassette may then be operatively connectable to a detector apparatus able to determine a property associated with the nanoscale wire. As used herein, a device is "operatively connectable" when it has the ability to attach and interact with another apparatus. In other cases, the cassette may be constructed and arranged such that samples may be gathered and determination at one site.

As an example, the present invention includes; in some embodiments, an integrated system comprising a nanoscale wire detector, a reader, and a computer controlled response system. In this example, the nanoscale wire detects a change in the equilibrium or concentration of an analyte in the sample, feeding a signal to the computer controlled response system, causing it to withhold or release a chemical or drug. This is useful as an implantable drug or chemical delivery system because of its small size and low energy requirements. Those of ordinary skill in the art are well aware of the parameters and requirements for constructing implantable devices, readers, and computer-controlled response systems suitable for use in connection with the present invention. That is, the knowledge of those of ordinary skill in the art, coupled with the disclosure herein of nanoscale wires as sensors, enables implantable devices, real-time measurement devices, integrated systems, and the like. Such systems can be made capable of monitoring one, or a plurality of, physiological characteristics individually or simultaneously.

In one aspect, the present invention provides any of the above-mentioned devices packaged in kits, optionally including instructions for use of the devices. As used herein, "instructions" can define a component of instructional utility (e.g., directions, guides, warnings, labels, notes, FAQs ("frequently asked questions"), etc., and typically involve written instructions on or associated with packaging of the invention. Instructions can also include instructional communications in any form (e.g., oral, electronic, digital, optical, visual, etc.), provided in any manner such that a user will clearly recognize that the instructions are to be associated with the device, e.g., as discussed herein. Additionally, the kit may include other components depending on the specific application, for example, containers, adapters, syringes, needles, replacement parts, etc. As used herein, "promoted" includes all methods of doing business including, but not limited to, methods of selling, advertising, assigning, licensing, contracting, instructing, educating, researching, importing, exporting, negotiating, financing, loaning, trading, vending, reselling, distributing, replacing, or the like that can be associated with the methods and compositions of the invention, e.g., as discussed herein. Promoting may also include, in some cases, seeking approval from a government agency to sell a composition of the invention for medicinal purposes. Methods of promotion can be performed by any party including, but not limited to, businesses (public or private), contractual or sub-contractual agencies, educational institutions such as colleges and universities, research institutions, hospitals or other clinical institutions, governmental agencies, etc. Promotional activities may include instructions or communications of any form (e.g., written, oral, and/or electronic communications, such as, but not limited to, e-mail, telephonic, facsimile, Internet, Web-based, etc.) that are clearly associated with the invention.

The following definitions will aid in the understanding of the invention. Certain devices of the invention may include wires or other components of scale commensurate with nanometer-scale wires, which includes nanotubes and nanowires. In some embodiments, however, the invention comprises articles that may be greater than nanometer size (e.g., micrometer-sized). As used herein, "nanoscopic-scale," "nanoscopic," "nanometer-scale," "nanoscale," the "nano-" prefix (for example, as in "nanostructured"), and the like generally refers to elements or articles having widths or diameters of less than about 1 micron, and less than about 100 nm in some cases. In all embodiments, specified widths can be a smallest width (i.e. a width as specified where, at that location, the article can have a larger width in a different dimension), or a largest width (i.e. where, at that location, the article has a width that is no wider than as specified, but can have a length that is greater).

As used herein, a "wire" generally refers to any material having a conductivity of or of similar magnitude to any semiconductor or any metal, and in some embodiments may be used to connect two electronic components such that they are in electronic communication with each other. For example, the terms "electrically conductive" or a "conductor" or an "electrical conductor" when used with reference to a "conducting" wire or a nanoscale wire, refers to the ability of that wire to pass charge. Typically, an electrically conductive nanoscale wire will have a resistivity comparable to that of metal or semiconductor materials, and in some cases, the electrically conductive nanoscale wire may have lower resistivities, for example, resistivities of less than about 100 microOhm cm ($\mu\Omega$cm). In some cases, the electrically conductive nanoscale wire will have a resistivity lower than about $10^{-3}$ ohm meters, lower than about $10^{-4}$ ohm meters, or lower than about $10^{-6}$ ohm meters or $10^{-7}$ ohm meters.

A "semiconductor," as used herein, is given its ordinary meaning in the art, i.e., an element having semiconductive or semi-metallic properties (i.e., between metallic and non-metallic properties). An example of a semiconductor is silicon. Other non-limiting examples include gallium, germanium, diamond (carbon), tin, selenium, tellurium, boron, or phosphorous.

A "nanoscopic wire" (also known herein as a "nanoscopic-scale wire" or "nanoscale wire") generally is a wire, that at any point along its length, has at least one cross-sectional dimension and, in some embodiments, two orthogonal cross-sectional dimensions less than 1 micron, less than about 500 nm, less than about 200 nm, less than about 150 nm, less than about 100 nm, less than about 70, less than about 50 nm, less than about 20 nm, less than about 10 nm, or less than about 5 nm. In other embodiments, the cross-sectional dimension can be less than 2 nm or 1 nm. In one set of embodiments, the nanoscale wire has at least one cross-sectional dimension ranging from 0.5 nm to 100 nm or 200 nm. In some cases, the nanoscale wire is electrically conductive. Where nanoscale wires are described having, for example, a core and an outer region, the above dimensions generally relate to those of the core. The cross-section of a nanoscopic wire may be of any arbitrary shape, including, but not limited to, circular, square, rectangular, annular, polygonal, or elliptical, and may be a regular or an irregular shape. The nanoscale wire may be solid or hollow. A non-limiting list of examples of materials from which nanoscale wires of the invention can be made appears below. Any nanoscale wire can be used in any of the embodiments described herein, including carbon nanotubes, molecular wires (i.e., wires formed of a single molecule), nanorods, nanowires, nanowhiskers, organic or inorganic conductive or semiconducting polymers, and the like, unless otherwise specified. Other conductive or semiconducting elements that may not be molecular wires, but are of various small nanoscopic-scale dimensions, can also be used in some instances, e.g. inorganic structures such as main group and metal atom-based wire-like silicon, transition metal-containing wires, gallium arsenide, gallium nitride, indium phosphide, germanium, cadmium selenide, etc. A wide variety of these and other nanoscale wires can be grown on and/or applied to surfaces in patterns useful for electronic devices in a manner similar to techniques described herein involving the specific nanoscale wires used as examples, without undue experimentation. The nanoscale wires, in some cases, may be formed having dimensions of at least about 1 micron, at least about 3 microns, at least about 5 microns, or at least about 10 microns or about 20 microns in length, and can be less than about 100 nm, less than about 80 nm, less than about 60 nm, less than about 40 nm, less than about 20 nm, less than about 10 nm, or less than about 5 nm in thickness (height and width). The nanoscale wires may have an aspect ratio (length to thickness) of greater than about 2:1, greater than about 3:1, greater than about 4:1, greater than about 5:1, greater than about 10:1, greater than about 25:1, greater than about 50:1, greater than about 75:1, greater than about 100:1, greater than about 150:1, greater than about 250:1, greater than about 500:1, greater than about 750:1, or greater than about 1000:1 or more in some cases. The nanoscopic wire may be, for example, a nanorod, a nanowire, a nanowhisker, or a nanotube. The nanoscopic wire may be used in a device, for example, as a semiconductor component, a pathway, etc. Selection of suitable conductors or semiconductors, including nanoscale wires, will be apparent and readily reproducible by those of ordinary skill in the art with the benefit of the present disclosure.

A "nanowire" (e.g. comprising silicon and/or another semiconductor material) is a nanoscopic wire that is typically a solid wire, and may be elongated in some cases. Preferably, a nanowire (which is abbreviated herein as "NW") is an elongated semiconductor, i.e., a nanoscale semiconductor. A "non-nanotube nanowire" is any nanowire that is not a nanotube. In one set of embodiments of the invention, a non-nanotube nanowire having an unmodified surface (not including an auxiliary reaction entity not inherent in the nanotube in the environment in which it is positioned) is used in any arrangement of the invention described herein in which a nanowire or nanotube can be used.

As used herein, a "nanotube" (e.g. a carbon nanotube) is a nanoscopic wire that is hollow, or that has a hollowed-out core, including those nanotubes known to those of ordinary skill in the art. "Nanotube" is abbreviated herein as "NT." Nanotubes are used as one example of small wires for use in the invention and, in certain embodiments, devices of the invention include wires of scale commensurate with nanotubes. Examples of nanotubes that may be used in the present invention include, but are not limited to, single-walled nanotubes (SWNTs). Structurally, SWNTs are formed of a single graphene sheet rolled into a seamless tube. Depending on the diameter and helicity, SWNTs can behave as one-dimensional metals and/or semiconductors. SWNTs. Methods of manufacture of nanotubes, including SWNTs, and characterization are known. Methods of selective functionalization on the ends and/or sides of nanotubes also are known, and the present invention makes use of these capabilities for molecular electronics in certain embodiments. Multi-walled nanotubes are well known, and can be used as well.

As used herein, an "elongated" article (e.g. a semiconductor or a section thereof) is an article for which, at any point along the longitudinal axis of the article, the ratio of the length of the article to the largest width at that point is greater than 2:1.

A "width" of an article, as used herein, is the distance of a straight line from a point on a perimeter of the article, through the center of the article, to another point on the perimeter of the article. As used herein, a "width" or a "cross-sectional dimension" at a point along a longitudinal axis of an article is the distance along a straight line that passes through the center of a cross-section of the article at that point and connects two points on the perimeter of the cross-section. The "cross-section" at a point along the longitudinal axis of an article is a plane at that point that crosses the article and is orthogonal to the longitudinal axis of the article. The "longitudinal axis" of an article is the axis along the largest dimension of the article. Similarly, a "longitudinal section" of an article is a portion of the article along the longitudinal axis of the article that can have any length greater than zero and less than or equal to the length of the article. Additionally, the "length" of an elongated article is a distance along the longitudinal axis from end to end of the article.

As used herein, a "cylindrical" article is an article having an exterior shaped like a cylinder, but does not define or reflect any properties regarding the interior of the article. In other words, a cylindrical article may have a solid interior, may have a hollowed-out interior, etc. Generally, a cross-section of a cylindrical article appears to be circular or approximately circular, but other cross-sectional shapes are also possible, such as a hexagonal shape. The cross-section may have any arbitrary shape, including, but not limited to, square, rectangular, or elliptical. Regular and irregular shapes are also included.

As used herein, an "array" of articles (e.g., nanoscopic wires) comprises a plurality of the articles, for example, a series of aligned nanoscale wires, which may or may not be in contact with each other. As used herein, a "crossed array" or a "crossbar array" is an array where at least one of the articles contacts either another of the articles or a signal node (e.g., an electrode).

The invention provides, in certain embodiments, a nanoscale wire or wires forming part of a system constructed and arranged to determine an analyte in a sample to which the nanoscale wire(s) is exposed. "Determine," in this context, generally refers to the analysis of a species, for example, quantitatively or qualitatively, and/or the detection of the presence or absence of the species. "Determining" may also refer to the analysis of an interaction between two or more species, for example, quantitatively or qualitatively, and/or by detecting the presence or absence of the interaction, e.g. determination of the binding between two species. As an example, an analyte may cause a determinable change in an electrical property of a nanoscale wire (e.g., electrical conductivity, resistivity, impedance, etc.), a change in an optical property of the nanoscale wire, etc. Examples of determination techniques include, but are not limited to, piezoelectric measurement, electrochemical measurement, electromagnetic measurement, photodetection, mechanical measurement, acoustic measurement, gravimetric measurement, and the like. "Determining" also means detecting or quantifying interaction between species.

A "fluid," as used herein, generally refers to a substance that tends to flow and to conform to the outline of its container. Typically, fluids are materials that are unable to withstand a static shear stress. When a shear stress is applied to a fluid, it experiences a continuing and permanent distortion. Typical fluids include liquids and gases, but may also include free-flowing solid particles, viscoelastic fluids, and the like.

As used herein, a component that is "immobilized relative to" another component either is fastened to the other component or is indirectly fastened to the other component, e.g., by being fastened to a third component to which the other component also is fastened. For example, a first entity is immobilized relative to a second entity if a species fastened to the surface of the first entity attaches to an entity, and a species on the surface of the second entity attaches to the same entity, where the entity can be a single entity, a complex entity of multiple species, another particle, etc. In certain embodiments, a component that is immobilized relative to another component is immobilized using bonds that are stable, for example, in solution or suspension. In some embodiments, non-specific binding of a component to another component, where the components may easily separate due to solvent or thermal effects, is not preferred.

As used herein, "fastened to or adapted to be fastened to," as used in the context of a species relative to another species or a species relative to a surface of an article (such as a nanoscale wire), or to a surface of an article relative to another surface, means that the species and/or surfaces are chemically or biochemically linked to or adapted to be linked to, respectively, each other via covalent attachment, attachment via specific biological binding (e.g., biotin/streptavidin), coordinative bonding such as chelate/metal binding, or the like. For example, "fastened" in this context includes multiple chemical linkages, multiple chemical/biological linkages, etc., including, but not limited to, a binding species such as a peptide synthesized on a nanoscale wire, a binding species specifically biologically coupled to an antibody which is bound to a protein such as protein A, which is attached to a nanoscale wire, a binding species that forms a part of a molecule, which in turn is specifically biologically bound to a binding partner covalently fastened to a surface of a nanoscale wire, etc. A species also is adapted to be fastened to a surface if a surface carries a particular nucleotide sequence, and the species includes a complementary nucleotide sequence.

"Specifically fastened" or "adapted to be specifically fastened" means a species is chemically or biochemically linked to or adapted to be linked to, respectively, another specimen or to a surface as described above with respect to the definition of "fastened to or adapted to be fastened," but excluding essentially all non-specific binding. "Covalently fastened" means fastened via essentially nothing other than one or more covalent bonds.

The term "binding" refers to the interaction between a corresponding pair of molecules or surfaces that exhibit mutual affinity or binding capacity, typically due to specific or non-specific binding or interaction, including, but not limited to, biochemical, physiological, and/or chemical interactions. "Biological binding" defines a type of interaction that occurs between pairs of molecules including proteins, nucleic acids, glycoproteins, carbohydrates, hormones and the like. Specific non-limiting examples include antibody/antigen, antibody/hapten, enzyme/substrate, enzyme/inhibitor, enzyme/cofactor, binding protein/substrate, carrier protein/substrate, lectin/carbohydrate, receptor/hormone, receptor/effector, complementary strands of nucleic acid, protein/nucleic acid repressor/inducer, ligand/cell surface receptor, virus/ligand, virus/cell surface receptor, etc.

The term "binding partner" refers to a molecule that can undergo binding with a particular molecule. Biological binding partners are examples. For example, Protein A is a binding partner of the biological molecule IgG, and vice versa. Other non-limiting examples include nucleic acid-nucleic acid binding, nucleic acid-protein binding, protein-protein binding, enzyme-substrate binding, receptor-ligand binding, receptor-hormone binding, antibody-antigen binding, etc. Binding partners include specific, semi-specific, and non-specific binding partners as known to those of ordinary skill in the art. For example, Protein A is usually regarded as a "non-specific" or semi-specific binder. The term "specifically binds," when referring to a binding partner (e.g., protein, nucleic acid, antibody, etc.), refers to a reaction that is determinative of the presence and/or identity of one or other member of the binding pair in a mixture of heterogeneous molecules (e.g., proteins and other biologics). Thus, for example, in the case of a receptor/ligand binding pair the ligand would specifically and/or preferentially select its receptor from a complex mixture of molecules, or vice versa. An enzyme would specifically bind to its substrate, a nucleic acid would specifically bind to its complement, an antibody would specifically bind to its antigen. Other examples include nucleic acids that specifically bind (hybridize) to their complement, antibodies specifically bind to their antigen, binding pairs such as those described above, and the like. The binding may be by one or more of a variety of mechanisms including, but not limited to ionic interactions, and/or covalent interactions, and/or hydrophobic interactions, and/or van der Waals interactions, etc.

The terms "polypeptide," "peptide," and "protein" are used interchangeably herein to refer to a polymer of amino acid residues. The terms apply to amino acid polymers in which one or more amino acid residue is an artificial chemical analogue of a corresponding naturally occurring amino acid, as well as to naturally occurring amino acid polymers. The term also includes variants on the traditional peptide linkage joining the amino acids making up the polypeptide.

As used herein, an "antibody" refers to a protein or glycoprotein including one or more polypeptides substantially encoded by immunoglobulin genes or fragments of immunoglobulin genes. The recognized immunoglobulin genes include the kappa, lambda, alpha, gamma, delta, epsilon and mu constant region genes, as well as myriad immunoglobulin variable region genes. Light chains are classified as either kappa or lambda. Heavy chains are classified as gamma, mu, alpha, delta, or epsilon, which in turn define the immunoglobulin classes, IgG, IgM, IgA, IgD and IgE, respectively. A typical immunoglobulin (antibody) structural unit is known to comprise a tetramer. Each tetramer is composed of two identical pairs of polypeptide chains, each pair having one "light" (about 25 kD) and one "heavy" chain (about 50-70 kD). The N-terminus of each chain defines a variable region of about 100 to 110 or more amino acids primarily responsible for antigen recognition. The terms variable light chain (VL) and variable heavy chain (VH) refer to these light and heavy chains respectively. Antibodies exist as intact immunoglobulins or as a number of well characterized fragments produced by digestion with various peptidases. Thus, for example, pepsin digests an antibody below (i.e. toward the Fc domain) the disulfide linkages in the hinge region to produce F(ab)'2, a dimer of Fab which itself is a light chain joined to $V_H$-$C_H$1 by a disulfide bond. The F(ab)'2 may be reduced under mild conditions to break the disulfide linkage in the hinge region thereby converting the (Fab')2 dimer into an Fab' monomer. The Fab' monomer is essentially a Fab with part of the hinge region (see, Paul (1993) *Fundamental Immunology*, Raven Press, N.Y. for a more detailed description of other antibody fragments). While various antibody fragments are defined in terms of the digestion of an intact antibody, one of skill will appreciate that such fragments may be synthesized de novo either chemically, by utilizing recombinant DNA methodology, or by "phage display" methods (see, e.g., Vaughan et al. (1996) *Nature Biotechnology*, 14(3): 309-314, and PCT/US96/10287). Preferred antibodies include single chain antibodies, e.g., single chain Fv (scFv) antibodies in which a variable heavy and a variable light chain are joined together (directly or through a peptide linker) to form a continuous polypeptide.

The following documents are incorporated herein by reference in their entirety for all purposes, and include additional description of teachings usable with the present invention: U.S. patent application Ser. No. 09/935,776, filed Aug. 22, 2001, entitled "Doped Elongated Semiconductors, Growing Such Semiconductors, Devices Including Such Semiconductors, and Fabricating Such Devices," by Lieber, et al., published as U.S. Patent Application Publication No. 2002/0130311 on Sep. 19, 2002; U.S. patent application Ser. No. 10/033,369, filed Oct. 24, 2001, entitled "Nanoscopic Wire-Based Devices and Arrays," by Lieber, et al., published as U.S. Patent Application Publication No. 2002/0130353 on Sep. 19, 2002, now U.S. Pat. No. 6,781,166, issued Aug. 24, 2004; U.S. patent application Ser. No. 10/020,004, filed Dec. 11, 2001, entitled "Nanosensors," by Lieber, et al., published as U.S. Patent Application Publication No. 2002/0117659 on Aug. 29, 2002; U.S. patent application Ser. No. 10/152,490, filed May 20, 2002, entitled "Nanoscale Wires and Related Devices," by Lieber, et al.; U.S. patent application Ser. No. 10/196,337, filed Jul. 16, 2002, entitled "Nanoscale Wires and Related Devices," by Lieber, et al., published as U.S. Patent Application Publication No. 2003/0089899 on May 15, 2003; U.S. patent application Ser. No. 10/720,020, filed Nov. 21, 2003, entitled "Nanoscale Wires and Related Devices," by Lieber, et at, published as U.S. Patent Application Publication No. 2003/0089899 on May 15, 2003; U.S. patent application Ser. No. 10/812,653, filed Mar. 29, 2004, entitled "Nanoscopic Wire-Based Devices and Arrays," by Lieber, et al., published as U.S. Patent Application Publication No. 2004/0188721 on Sep. 30, 2004; U.S. patent application Ser. No. 10/973,665, filed Oct. 26, 2004, entitled "Nanoscopic Wire-Based Devices and Arrays," by Lieber, et at, published as U.S. Patent Application Publication No. 2005/0117441 on Jun. 2, 2005; U.S. patent application Ser. No. 10/995,075, filed Nov. 22, 2004, entitled "Nanoscale Arrays and Related Devices," by Whang, et al., published as U.S. Patent Application Publication No. 2005/0253137 on Nov. 17, 2005; U.S. patent application Ser. No. 11/058,443, filed Feb. 14, 2005, entitled "Nanoscale Wires and Related Devices," by Lieber, et al.; International Patent Application No. PCT/US2005/004459, filed Feb. 14, 2005, entitled "Nanostructures Containing Metal-Semiconductor Compounds," by Lieber, et at, published as WO 2005/093831 on Oct. 6, 2005; U.S. patent application Ser. No 11/137,784, filed May 25, 2005, entitled "Nanoscale Sensors," by Lieber, et al.; U.S. Provisional Patent Application Ser. No. 60/707,136, filed Aug. 9, 2005, entitled "Nanoscale Sensors," by Lieber, et at; U.S. Provisional Patent Application Ser. No. 60/790,322, filed Apr. 7, 2006, entitled "Nanoscale Wire Methods and Devices," by Lieber, et al.; U.S. Provisional Patent Application Ser. No. 60/812,884, filed Jun. 12, 2006, entitled "Nanosensors and Related Technologies," by Lieber, et al.; U.S. patent application Ser. No. 11/501,466, filed Aug. 9, 2006, entitled "Nanoscale Sensors," by Lieber, et al.; and U.S. Provisional Patent Application Ser. No. 60/843,681, filed Sep. 11, 2006, entitled "Branched Nanoscale Wires," by Lieber, et at.

The following examples are intended to illustrate certain embodiments of the present invention, but do not exemplify the full scope of the invention.

Example 1

Hetero-branched nanostructures, which may have structures incorporating distinct backbone and branch grafts, can have well-controlled variations in composition and/or doping. These examples illustrate a general multi-step approach that enables the controlled synthesis of a great diversity of hetero-branched nanostructures, with fine control over structure, composition, doping, and functionalities, and further demonstrate their application in a wide range of nanoscale devices, such as localized and addressable light emitting diode (LEDs) arrays, logic circuits, biological sensors, and the like.

In this example, two branched structures are illustrated: S/S(M) (semiconductor/semiconductor(metal)) and S/O/S (M) (semiconductor/oxide/semiconductor(metal)). Briefly, the synthesis of these branched structures starts from two kinds of backbones, bare semiconductor nanowires and semiconductor/oxide core/shell nanowires, followed by selective deposition of Au nanoparticles (NPs) on the backbone surface via galvanic surface reduction (FIG. 1A) and polylysine assisted adsorption, respectively (FIG. 5). Then, these two types of nanowire composites are subject to branch growth, via either vapor-phase or solution-phase synthesis (FIG. 1A). FIGS. 1B-1I show the detailed structural characterizations for representative branched composites, such as Si/Au (FIG. 1B-1D), Si/Ge (FIG. 1E-1F), Si/CdS (FIG. 1G), Si/GaAs (FIG. 1H) and Si/InP (FIG. 1I).

Figure 5A:
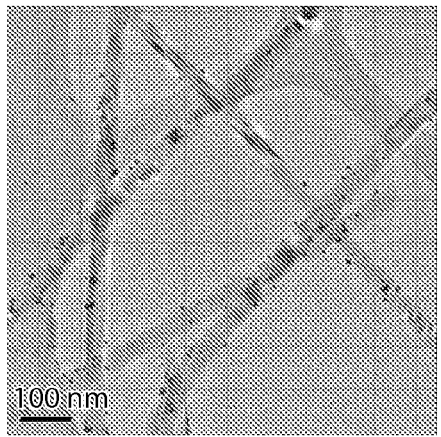
FIGS. 5A-5D shows the selective deposition of nanoparticles onto a nanoscale wire surface, in one embodiment of the invention.
Figure 5B:
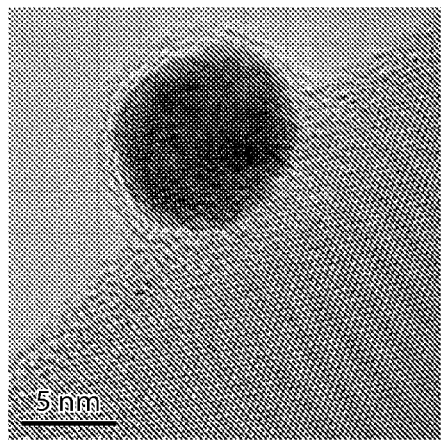
Figure 5C:
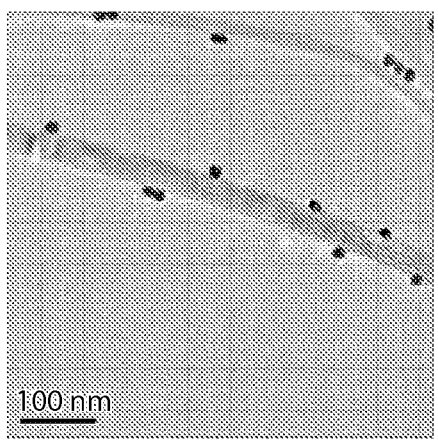
Figure 5D:
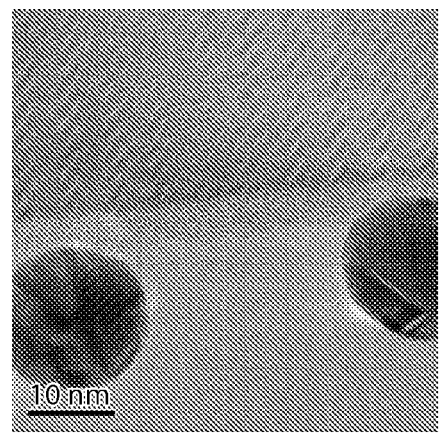

FIG. 5A shows a low resolution TEM image of Si nanowire (NW)/Au nanoparticles (NPs) backbones prepared via galvanic surface reduction ($C_{HAuCl_4}$=$10^{-5}$ M, deposition time=5 min). Generally, the density of Au particles on the Si nanowire surface was determined by the concentration of $HAuCl_4$ solution ($C_{HAuCl_4}$), and the particle sine was dependent on both $C_{HAuCl_4}$ and deposition time. FIG. 5B is an HRTEM image of the Si nanowire/Au nanoparticle interface. FIG. 5C is a low resolution TEM image of Si/$SiO_2$ core-shell nanowire/Au nanoparticles backbones prepared via polylysine assisted adsorption. FIG. 5D is an HRTEM image of the Si nanowire/$SiO_2$/Au nanoparticle interface.

Figure 1B:
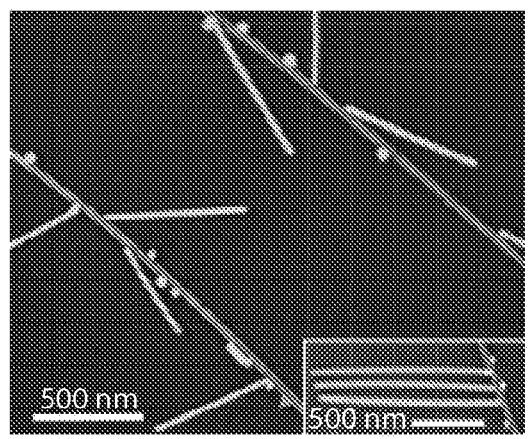
Figure 1C:
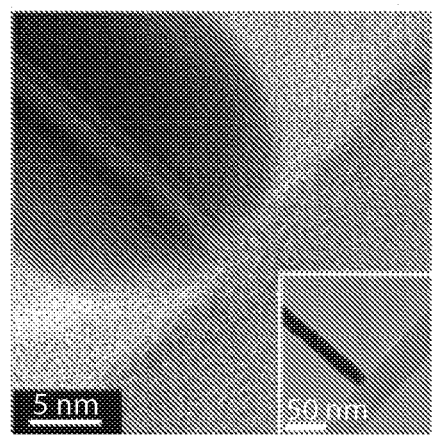
Figure 1D:
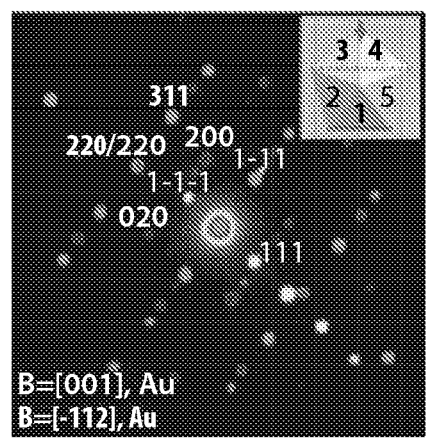
Figure 1E:
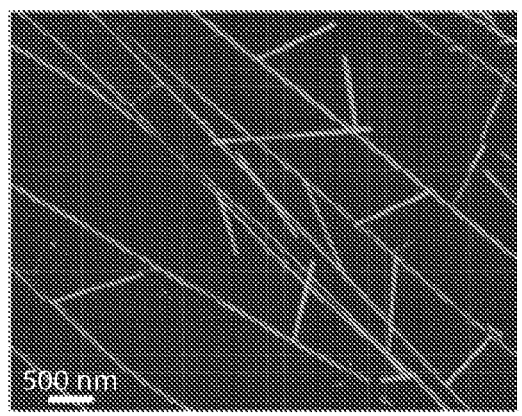

FIG. 1B shows a scanning electron microscropy (SEM) image of Si/Au branched nanostructures prepared via seed mediated solution phase growth. The aspect ratio of the Au branches is around 15 to 30, and their diameter ranges from 15 nm to 80 nm, depending on the specific synthesis parameters. Generally, smaller Au nanoparticle seeds (e.g. 5 nm, lower $C_{HAuCl_4}$ (e.g., 2×10⁻⁴ M), or higher $C_{CTAB}$ (e.g., 0.1 M) favors the formation of Au branches with larger aspect ratio and smaller diameter (see below for more details). The spacing between the adjacent Si/Au junctions could be scaled down to below 100 nm (FIG. 1B, inset), which is useful for high density device integration.

TEM (FIG. 1C, inset) images of Si/Au branched nanostructures indicate the twinned nature of Au branches and distinct backbone/branch junctions. Higher resolution transmission electron microscopy (HRTEM) images of Si/Au junction (FIG. 1C) details the twinned planes of facetted Au branches, and combined with Selected Area Electron Diffraction (SAED) patterns (FIG. 1D), the Au branches appeared to feature five-fold twinning symmetry and growth along <110> axis.

A model of this (FIG. 1D, inset) indicated that the incident beam direction (arrow) with respect to the crystal orientation would produce an overlay of rectangular <112> and square <100> zone patterns of a face-centered cubic structure (a=0.4078 nm). In this figure, a SAED pattern of the junction region shown in FIG. 1F, where the various spots originate from the <100>$_{Au}$ and <112>$_{Au}$, as well as diffractions from Si stem. Double diffraction reflections are not marked for clarity. The inset shows a cross section model of the penta-twinned Au branch, which is composed of five twinned subunits. Three of the five subunits are aligned along crystallographic zones, among them subunit 1 diffracts along the <100> direction and subunits 3 and 4 along the <112> direction. The arrow marks the incident beam direction.

Figure 1F:
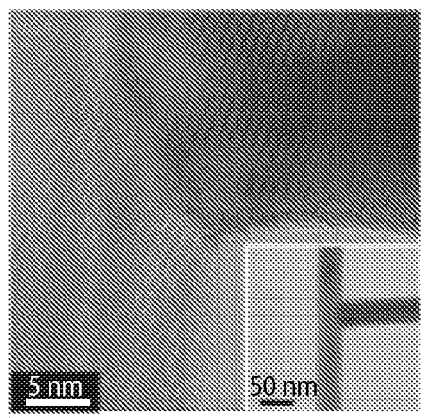
Figure 1G:
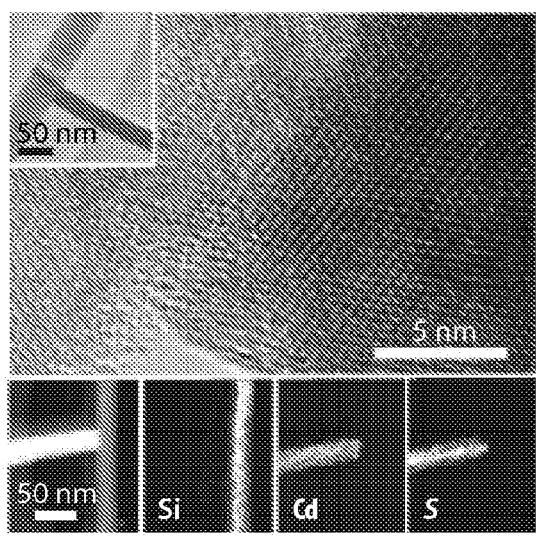
Figure 1H:
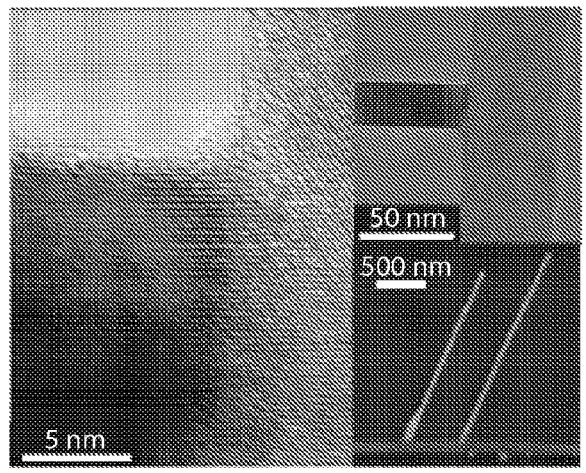
Figure 1I:
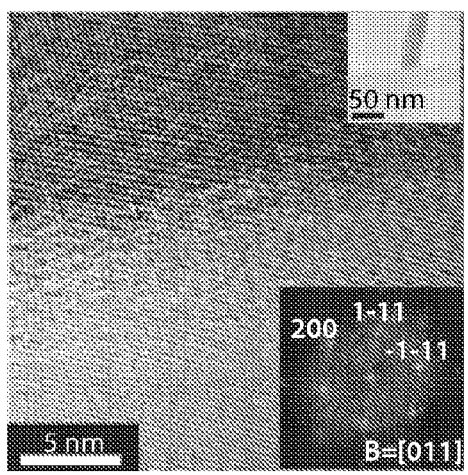

An SEM image of Si/Ge branched nanostructures prepared via vapor-liquid-solid (VLS) process (FIG. 1E) demonstrates high yield and uniformity of the synthesized Ge branches. The deposited Au nanoparticles function as catalysts to direct the branch growth, and predetermine the density and diameter of the branches. FIG. 1F shows an HRTEM image of a junction of a Si/Ge branched nanostructure, from which the epitaxial nature of the branch growth can be seen $$\left(\text{lattice mismatch, } \varepsilon_m = \frac{a_{backbone} - a_{branch}}{a_{backbone}}: 4.2\%\right).$$

These experiments show that a pre-annealing step at 450° C. may facilitate better epitaxy in this system, which is believed to induce the alloying between Si backbones and Au nanoparticles, and may contribute to the epitaxial Ge branch growth in the following step.

The growth of II-VI or III-V semiconductors on silicon would allow the integration of their superior (opto-)electronic properties with silicon technology. II-VI semiconductor branches, such as CdS, ZnS, CdSe, ZnSe can be easily grafted onto the Si stems, among which ZnSe nanowires with zinc-blend structure can be epitaxially integrated onto the Si backbones (lattice mismatch: 4.4%). Scanning transmission electron microscopy (STEM) image and energy dispersive X-ray (EDX) mapping (Si, Cd and S) (FIG. 1G) shows distinct Si/CdS junctions and clean Si backbones free of CdS homogenous shell coating or island formation. The cleanness of the backbone material is similarly demonstrated for most hetero-branched nanostructures shown in these experiments. In addition, various important III-V semiconductors, such as GaP, GaAs and InP, have been successfully integrated with the Si nanowires. TEM (FIG. 1H, upper inset) and SEM (FIG. 1H, lower inset) images of Si/GaAs branched nanostructures show good branching quality, and HRTEM images (FIG. 1H) of the Si/GaAs junction show its epitaxy (lattice mismatch: 4.1%). It should be noted that high quality InP branches (FIG. 1I) could also be epitaxially grown from the Si nanowire backbones, which is quite difficult for their bulk counterparts due to the considerable lattice mismatch (8.1%). This figure shows HRTEM, TEM (upper right inset) and FFT (lower right inset) images of the same Si/InP branch junction. The (111) plane spacings of InP branch and Si backbones are about 0.345 nm and 0.318 nm, respectively.

Figure 1J:
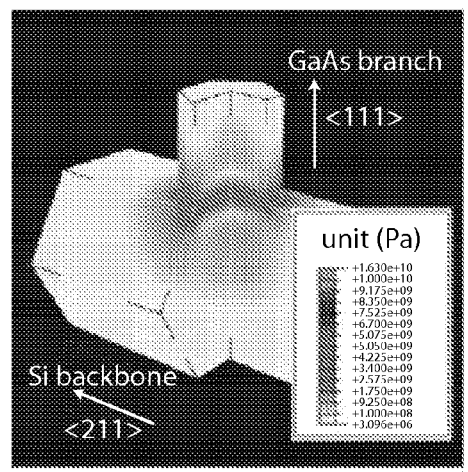

The stress $$\left(\sigma = \frac{\text{Load}}{\text{Area}} = \frac{F}{A}\right)$$

due to lattice mismatch of the hetero-branched nanostructures decayed exponentially (~exp(-x/L), the decay length L is ~R/2.4, R is the radius of cylindrical branch) from the junction region. FIG. 1J shows the simulated von Mises Stress ($\sigma_v$) field of the Si/GaAs branched nanostructure via Finite Element Methods (FEM). Stress is in general a six-dimensional tensor quantity (a symmetric 3×3 tensor). von Mises stress reduces this to a single number (a scalar) for the purposes of calculating yield criteria. von Mises stress in three dimensions is $$\sigma_v = \sqrt{\frac{(\sigma_1 - \sigma_2)^2 + (\sigma_2 - \sigma_3)^2 + (\sigma_3 - \sigma_1)^2}{2}},$$

where $\sigma_1$, $\sigma_2$, and $\sigma_3$ are the principal stresses. The axis of GaAs branch is along <111>, while that of Si stem is along <211>. The simulated mapping suggests that stresses of the hetero-branched nanosystems are significant in regions near the junctions (especially the junction boundary), of dimensions comparable to ¼ branch width, and produces deformations of negligible magnitude at distances longer than the width of branch from the junction region. The ease to release the large strain may thus allow the synthesis of aforementioned epitaxial hetero-branched nanostructures.

A close inspection of the strain $$\left(\varepsilon = \frac{\text{change in length}}{\text{original length}} = \frac{\Delta L}{L}\right)$$

distribution shows that a large lattice mismatch would have very small bending effects on the backbone material, which could be readily tolerated with the "flexible" nature of backbone nanowire. This nanoscopic elasticity of nanowires differs from that of their macroscopic planar counterparts, and might also contribute to the better epitaxy. The 3D-branched nanostructures can significantly extend the variety of hetero-epitaxial nanosystems in that the stem and branch growth do not share the same catalysts, as the case in block-by-block nanowires where their composition is thus limited, and that the strain energy of branched nanowire structures is much smaller than those in core-shell nanowires or planar lamellar structures, since the latter have much larger hetero junction areas. Compared with other nanowire systems, the well integrated and clean epitaxial branched nanostructures may have enhanced device mechanical robustness (lifetime), better device (opto-) electronic performance, and the like.

Example 2

Figure 2A:
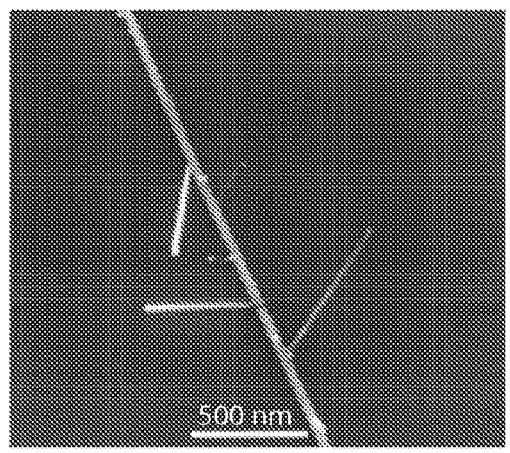
FIGS. 2A-2F shows the structural characterizations of certain branched nanoscale wires, according to another embodiment of the invention.
Figure 2B:
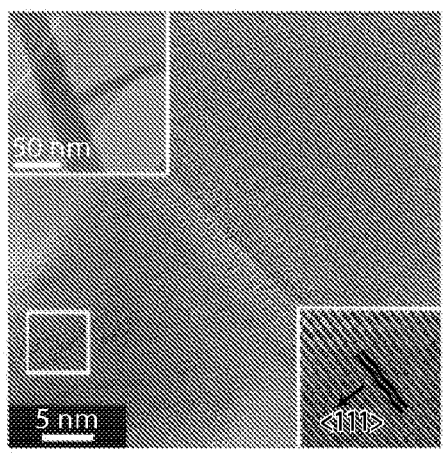
Figure 2C:
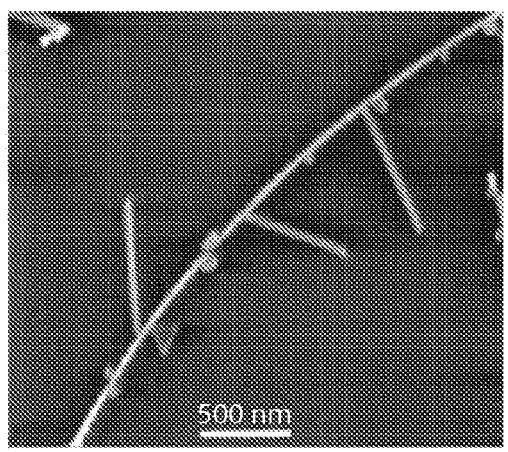
Figure 2D:
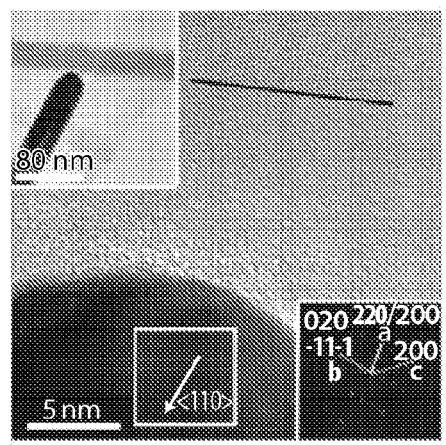

S/O/S(M) hetero-branched nanostructures represent another important category of structural/functional integration. SEM and TEM images of two typical composites, $Si/SiO_2/Ge$ (FIGS. 2A and 2B) and $Si/SiO_2/Au$ (FIGS. 2C and 2D), feature similar morphology to the branched nanostructures described above. An HRTEM image for a $Si/SiO_2/Ge$ (FIG. 2B) junction demonstrates the successful "grafting" of Ge branches onto the oxide surface in an intimate manner, featuring an oxide layer of 3-4 nm with very clean, sharp interfaces and high quality Ge branch that grows along <111> direction (FIG. 2B, lower right inset). (The upper left inset is a TEM.) For $Si/SiO_2/Au$ composites, an FFT pattern of the square region of the Au branch (FIG. 2D) further indicates the superposition of two specific crystallographic zones of general form, <112> and <100>, and determine the Au branch growth direction, <110>. In FIG. 2D, the black line marks the $SiO_2/Si$ interface. The lower right inset is an FFT pattern from the square region, which is an overlay of [001] and [−112] zone patterns. The marked spot in the FFT pattern is one of the associated double diffraction reflections, where a is the sum of vectors b and c, namely, a=b+c.

Figure 2E:
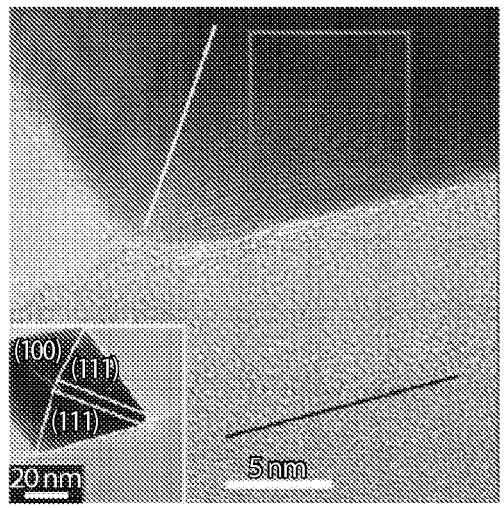
Figure 2F:
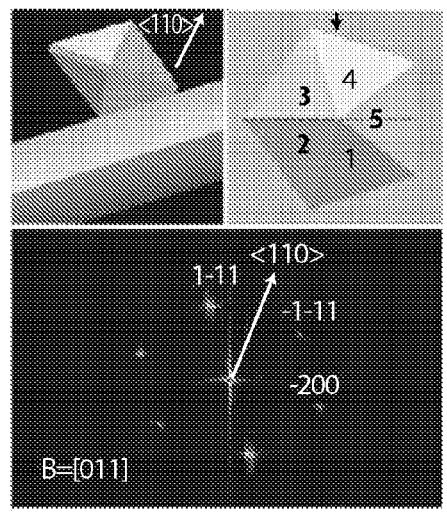

To investigate the seed mediated Au branch growth mechanism, systematic TEM studies were performed. FIG. 2E shows HRTEM and TEM image (inset) images of a Au branch at the nucleation stage. The FFT pattern (FIG. 2F) derived from the square region (FIG. 2E) features defined a [011] zone pattern, which could be explained by the model shown in upper right inset of FIG. 2F. This model is related to the previous one in FIG. 1G by a rotation of 18° around the common <110> central axis. Here, only subunit 5 contributed to the observed FFT pattern since subunits 1 and 4 were not aligned along the crystallographic zones and subunit 2 and 3 did not enter the square region shown in FIG. 2E. Subunit 5 is aligned along <110> crystallographic zone and thus gave the [011] zone pattern shown in FIG. 2F.

Accordingly, a 3-D model of the Si/Au nanostructure (FIG. 2F, upper left inset) was built and was consistent with its true morphology (FIG. 2E, inset), where the Au nanoparticle is a slightly elongated decahedron with five narrow {100} side faces and capped at both ends by five {111} faces. Combined with other data, at least two stages for Au branch growth can be envisioned. First, the twinned Au nuclei (5-15 nm) developed into larger decahedra shaped or slightly elongated decahedra Au nanoparticles, whose lateral dimension is limited possibly by lattice strain. Then, uniaxial elongation along <110> axis lead to the formation of facetted Au branches. The arrow in FIG. 2F (upper right inset) marks the incident beam direction. This alternative orientation of penta-twinned Au also contains three diffracting subunits, where subunit 5 is along the <110> zone, and subunits 2 and 3 are along <111> zone.

Example 3

Basic electronic characterization of single-branch input devices is an important step for the integration of more complex devices. In this example, fundamental nanodevices such as p-n diodes and FETs were demonstrated, based on the above branched structures. A typical case is a p-Si/n-Ge branched nanowire composite. Electrical transport studies were first carried out on two-terminal devices, with one metal contact on the p-Si nanowire backbone and the other on a n-Ge nanowire branch (FIG. 3A, upper inset, which shows an SEM image of a single-branch input p-Si/n-Ge diode). Bias was placed on the p-Si backbone, while the n-branches were grounded.

The device exhibited current rectification characteristic of p-n diodes with a low turn-on voltage of about 1.0 V (FIG. 3A, heavy curve), indicating the formation of p-n diode at the nanowire-nanowire junction point. Despite the simplicity of the device, it fully demonstrated the ability of creating certain doping profile in the synthesized branched nanostructures, which requires very delicate control over growth conditions to suppress the simultaneous radial growth (or overcoating) during the axial elongation of Ge branches, since the deposition of secondary dopants on the surface of the backbone can dominate its overall electronic properties. Similarly, p-Si/n-GaAs (FIG. 3A, upper curve) and p-Si/n-CdSe (FIG. 3A, lower curve) branched nanostructures also showed the typical current rectification behavior. Without further optimization, the Si/GaAs p-n diode showed a room temperature ideality factor of 2.4 as derived from the slope of the I-V curve on the semi-log scale (FIG. 3A, lower inset, showing an I-V curve of the same p-Si/n-GaAs diode on semi-log scale; the slope with ideality factor n=2.4 is shown by dashed line), which suggests the high quality of the branched p-n diodes.

Next, nanoscale junction field effect transistors (JFETs) were prepared with a three-terminal configuration with two contacts on the p-Si nanowire backbone as the source and drain electrodes, and one contact on the n-Ge nanowire branch as a gate electrode. Representative current versus branch-gate voltage ($I_{sd}$–$V_g$) data at a bias of −0.5 V (FIG. 3B, semi-log scale) exhibited a large decrease in conductance with increasing gate voltage and an almost linear response of the gate-dependent I-V characteristics near zero bias (inset of FIG. 3B). The branch-gate voltages are 0 V, 0.5 V, 1 V, 1.5 V, and 2 V along the direction marked by the arrow.

Figure 3A:
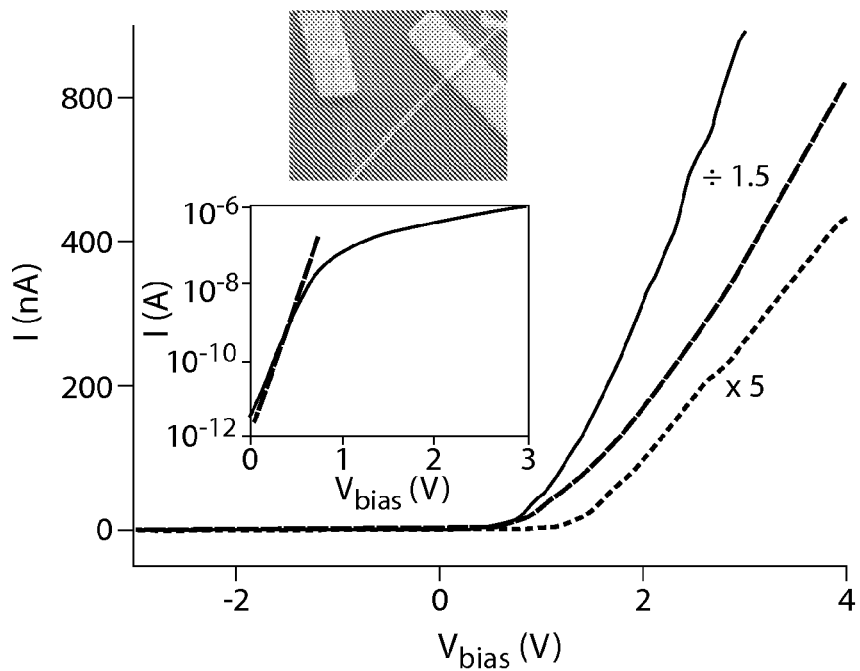
FIGS. 3A-3D shows the electronic characterization of various nanoscale wire devices, in yet another embodiment of the invention.
Figure 3B:
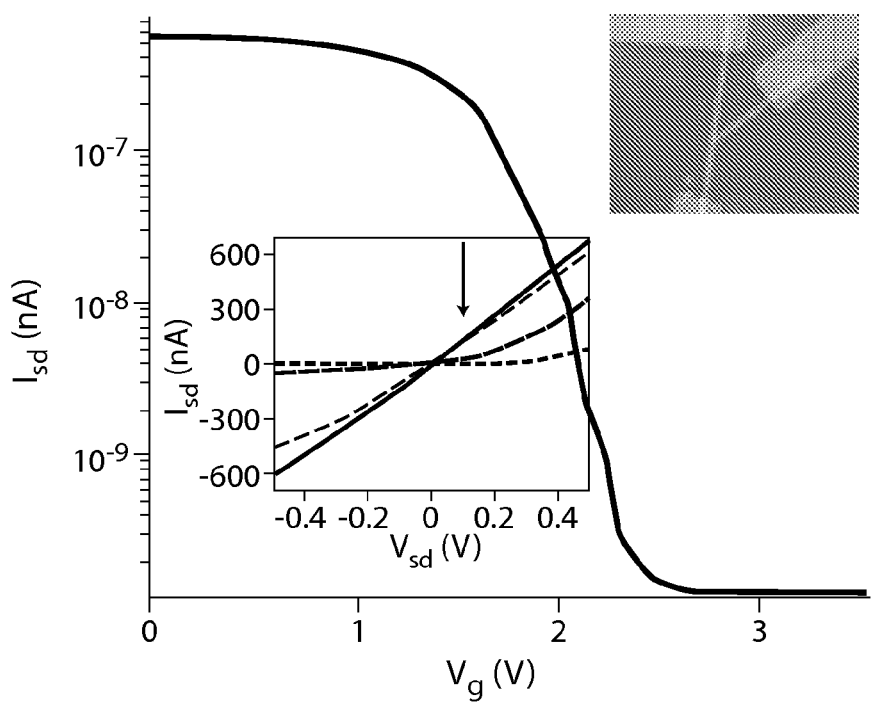
Figure 3C:
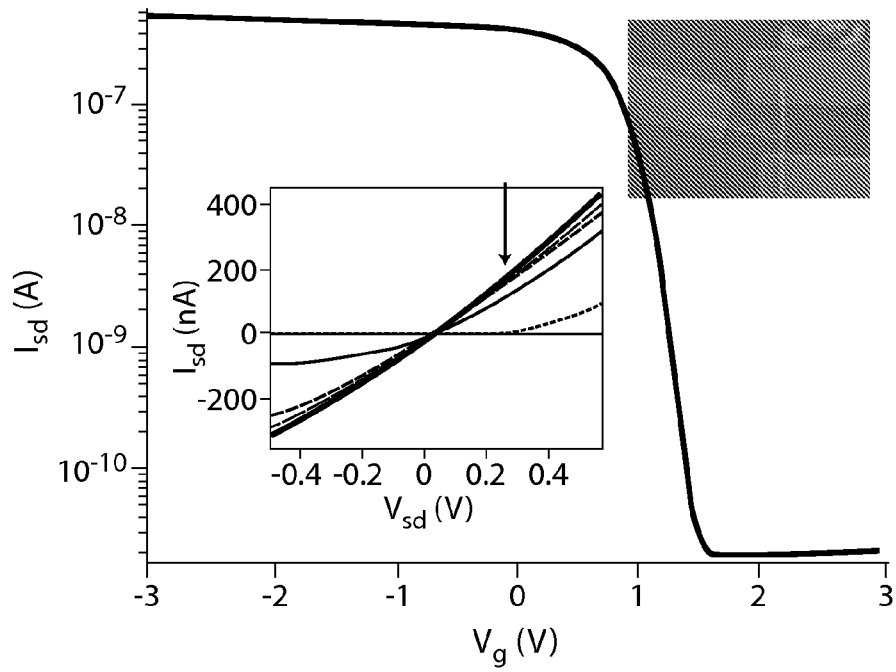
Figure 3D:
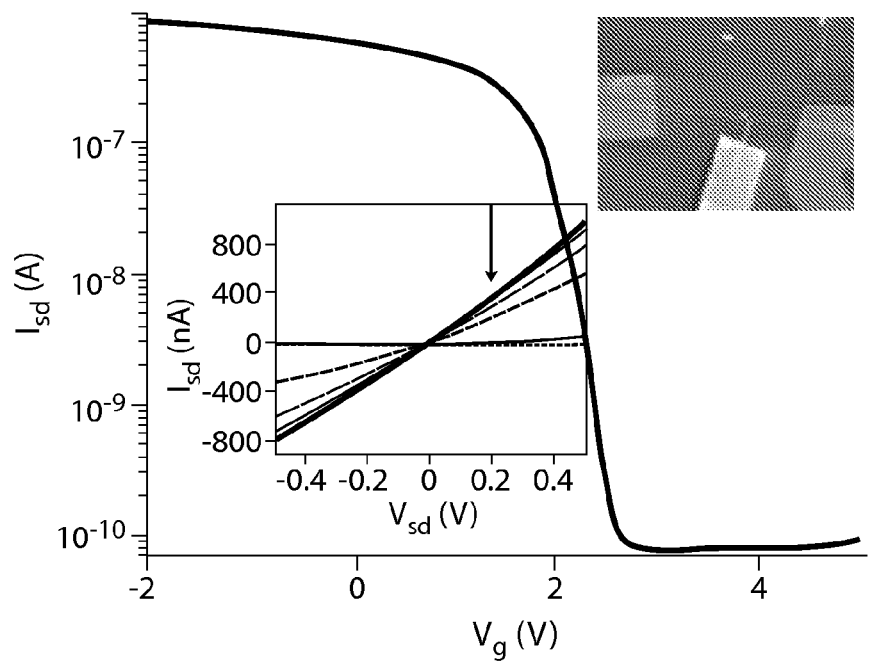

Branched nanowires having a core/shell segment were found to operate similar to a nanoscale MOSFET. FIGS. 3C and 3D show the I-$V_g$ data and gate-dependent I-V curves of $Si/SiO_2/Ge$ and $Si/SiO_2/Au$ branched nanodevices, where Ge and Au grafts serve as the local gates, respectively. The bias was 0.5 V and the results plotted on a semi-log scale. In both cases, smaller turn-off currents (<$10^{-10}$ A) and larger on/off ratios (>$10^4$) were observed, as compared with a p-Si/n-Ge JFET, which may be due to the existence of 3-10 nm insulating layer which could reduce the leakage current. The calculated subthreshold slope values for these two FET devices were 120 and 150 mV/decade respectively, with a similar transconductance of about 500 nS. In FIG. 3C, the lower left inset shows gate-dependent I-V characteristics of this device. The branch-gate voltages are −1.5 V, −1 V, −0.5 V, 0 V, 0.5 V, 1 V, and 1.5 V along the direction marked by the arrow. The upper right inset is a SEM image of a single-branch input p-Si/SiO$_2$/n-Ge FET. In FIG. 3D, the lower left inset shows gate-dependent I-V characteristics, where the branch-gate voltages are −2 V, −1 V, 0 V, 1 V, 2 V, and 3 V along the direction marked by the arrow, and the upper right inset is a SEM image of a single-branch input p-Si/SiO$_2$/Au FET.

Example 4

Figure 4A:
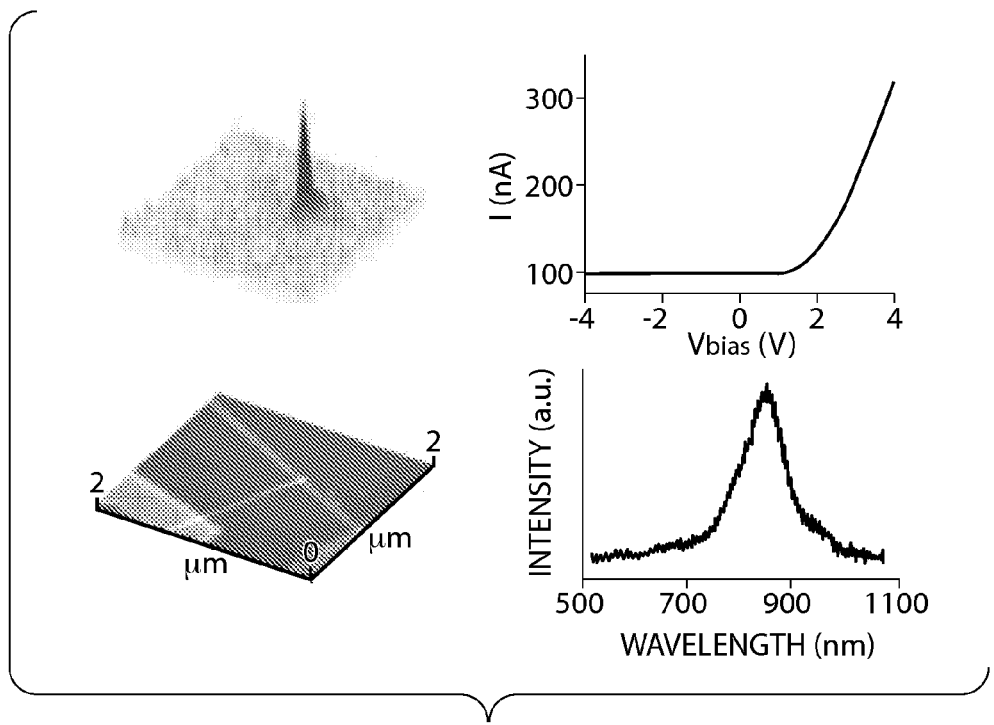
FIGS. 4A-4F shows the characterization of certain nanoscale wire devices, in still other embodiments of the invention.

FIG. 4A shows an electroluminescence (EL) image of localized emission from a forward-biased p-Si/n-GaAs branched junction. A current-voltage (I-V) curve of this junction showed well-defined current rectification, which was consistent with the aforementioned p-Si/n-GaAs diode (FIG. 3A). FIG. 4A shows a 3-D EL intensity plot (upper left panel), device image (lower left panel), current-voltage (I-V) curve (upper right panel) and EL spectrum (lower right panel) of the p-Si/n-GaAs branch junction LED. The Si backbone is forward biased at 12 V. The EL spectrum showed a peak maximum at 860 nm, which corresponded to the GaAs band-edge emission (bandgap, 1.43 eV) and demonstrated that branched p-Si/n-GaAs devices can function as infrared (IR) nanoLEDs. Studies of over 20 p-Si/n-GaAs nanoLEDs (data not shown)

yielded similar I-V and EL results. It should be noted that these branched LEDs appear to possess advantages over crossed nanowire LEDs; branches are directly grown from the backbones; thus, there is no oxide interlayer and much lower surface states at around the expitaxial junction.

Figure 4B:
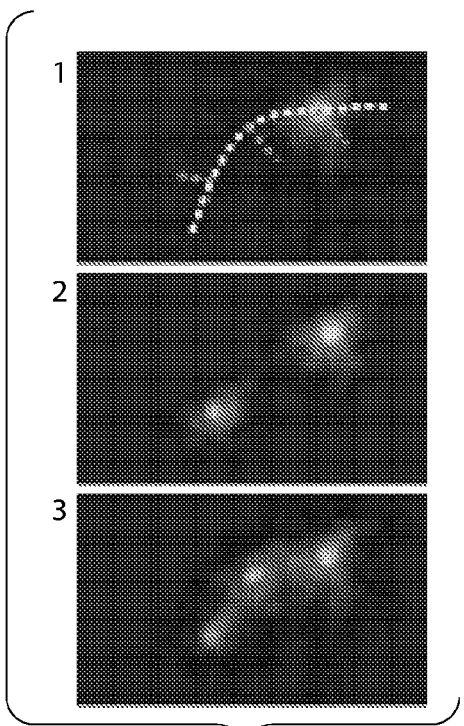

To build up more complex and functional devices, rational integration of these elements can be easily achieved in branched structures via multi-input device configurations. FIG. 4B shows the EL images of the three p-Si/n-GaAs branched junctions as each GaAs branch is sequentially grounded, with a bias of 10 V added to Si backbone. Significantly, when either one, two or three of the p-n junctions of this single p-Si/n-GaAs branched device (FIG. 4B) were forward biased, localized and addressable emission was observed from the junctions. The GaAs branches were sequentially grounded with a bias of 10 V added to Si backbone. The junctions were driven individually (FIG. 4B1) and simultaneously (FIGS. 4B2 and 4B3). Dashed lines mark the positions of Si backbone and the GaAs branches. These branched IR LEDs can also maintain their emissive properties upon repeated cycles of switch on and off and thus demonstrate the potential of this bottom-up approach for fabricating integrated photonic devices.

Figure 4C:
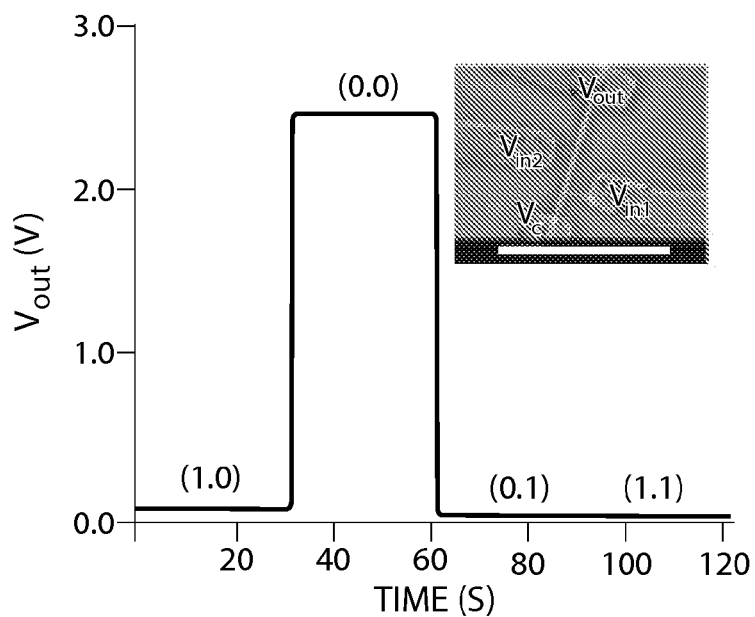

The multi-input configuration of branched p-Si/SiO$_2$/n-Ge structures enables the implementation of various diode- and FET-based logic gates. As an example, a NOR logic gate is analyzed in detail. Two sequential n-Ge branch inputs act as nanoscale gates (FIG. 4C), just as in single branch-input MOSFET (FIG. 3C). A constant resistor of 50 megohms was incorporated into the circuit and the p-Si nanowire channel was biased at 3 V. FIG. 4C shows the output voltage versus the four possible logic address level inputs: (0,1), (0,0), (1,0), and (1,1), where logic 0 input is 0 V and logic 1 input is 3 V. The right inset is an SEM image of the branched NOR gate device. The scale bar is 2 micrometers. When either one or both of the inputs are high (3 V), i.e., at least one of the two transistors is off, part of the p-Si nanowire channel will be depleted, inducing much higher resistances than that of the constant resistor; as a result, most of the voltage drops within the p-channel and low output voltage (logic 0) will be observed (FIG. 4C), and vise versa.

Figure 4D:
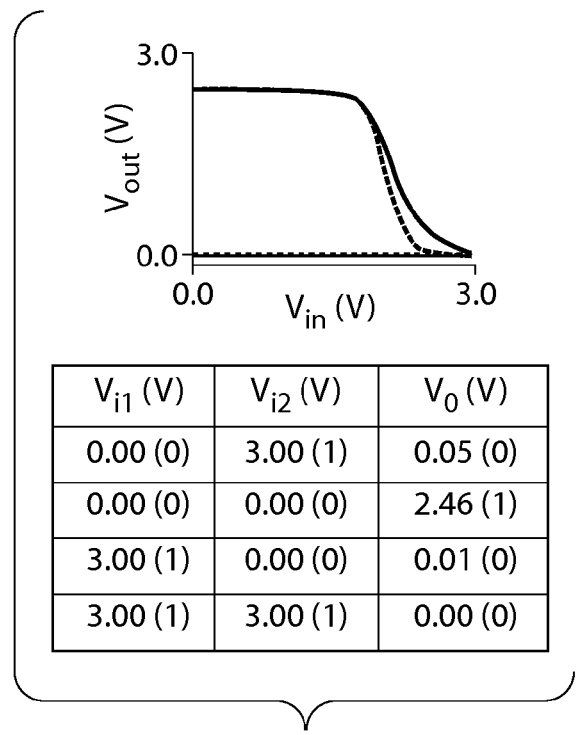

The $V_o$–$V_i$ curves and the truth table (FIG. 4D) detail the NOR logic gate behaviors: while continuously changing one of the input voltages, $V_o$ will be constantly low if the other input is high, and will exhibit a nonlinear response with large change in $V_o$ when the other input is set low. In FIG. 4D, the solid and dashed lines show $V_o$–$V_{i1}$ and $V_o$–$V_{i2}$ when the other input is 0 or 1, respectively.

Similarly, other logic gates like OR or AND have been fabricated from double input diode based branched structures (p-Si/n-Ge) (data not shown). These branch-input logic circuits, to some extent, can function analogously to neurons, in which the receiving, transduction and transfer of signals are structurally integrated in a compact and efficient way, thus possessing great potential in achieving more complex and fast hierarchical information networks.

Example 5

In this example, the potential to implement label-free and real time detection of cancer marker, prostate specific antigen (PSA), using branched p-Si/Au nanostructures was investigated. To better understand the "separate" and "cooperative" functionalities of integrated branches/backbones, selective modification chemistry was employed. The fabrication of branched Si/Au 3-D sensors was carried out by coupling the antibody molecules (Anti-PSA) only to the Au branch surface via a succinimidyl/primary amine reaction. Anti-PSA could then reversibly trap the negatively charged PSA macromolecules (pI of PSA, 6.8; pH of buffer, 7.4) close to the p-Si/Au junction regions, which accumulates the holes and increase the conductance of p-Si channel. The conductance output was simultaneously monitored as a function of time.

Figure 4E:
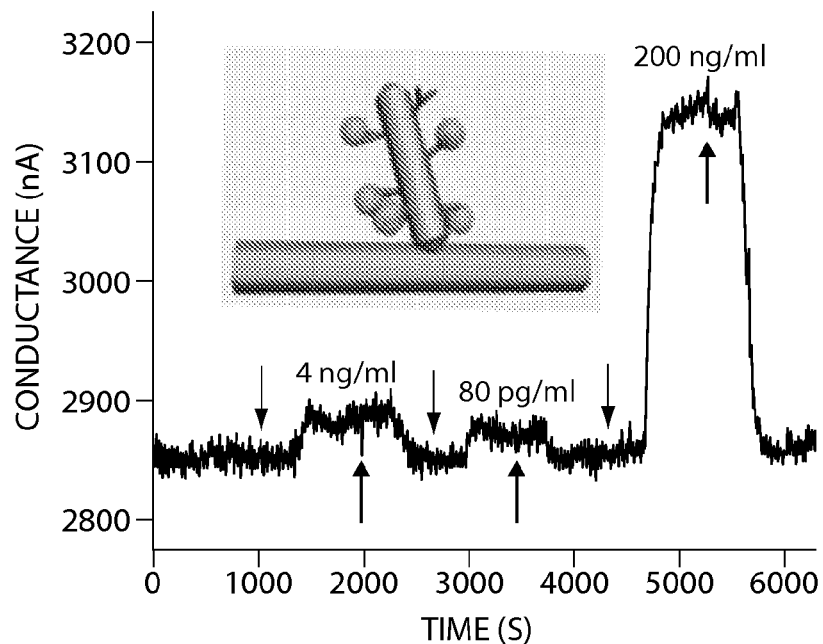

Time-dependent curves (FIG. 4E) featured well-defined conductance increase and subsequent decrease to baseline when PSA solutions and buffer solutions were delivered to the device working area. The curves were recorded after alternate delivery of prostate specific antigen (PSA) with different concentrations and pure buffer solutions. The arrows mark the injection of protein solutions and buffer solutions to the guiding polymer tube inlet, respectively. The inset is a schema of a Si/Au branched sensor. The Au branches were functionalized with succinimidyl (NHS) groups, which could efficiently, bind with the primary amine of the anti-PSA.

Figure 4F:
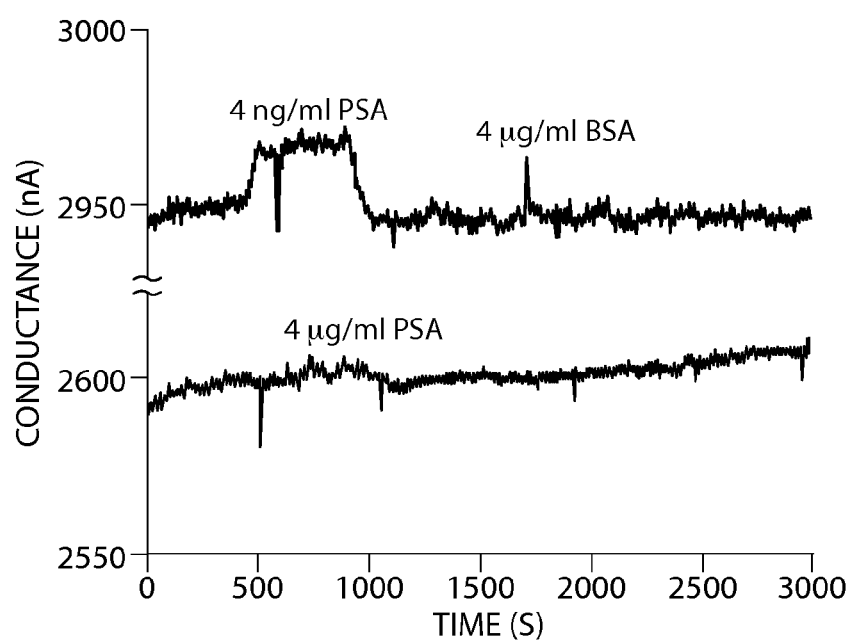

The data show that the label-free detection of PSA could be achieved with a signal-to-noise ratio of >3 for concentrations down to 80 pg/ml or about 3 pM. Control binding experiments (FIG. 4F, upper curve) with bovine serum albumin (BSA) showed that no signals could be detected even highly concentrated BSA buffer solution (4 micrograms/ml) was delivered. The arrows mark the injection of protein solutions to the guiding polymer tube inlet. Without grafting Au branches but with the same surface modification procedures done on bare Si nanowires, a stable and clear conductance increase was not observed (FIG. 4F, lower curve), which demonstrates that there was no nonspecific binding of PSA macromolecules on the Si backbones.

3-D sensors may have larger effective sensing areas and volumes, which may trap more substrates and the sensing time might be reduced for a proper system. The Au branches are electrochemically active, and hence can be used to investigate redox or biocatalysis reaction processes. The Si and/or Au surfaces can also be selectively functionalized with different anchoring groups, which allow the electrochemical study of more complicated dynamic systems where electron/energy transfer or host-guest interplay is involved.

Example 6

This example describes additional details of the procedures used in Examples 1-5.

Si nanowires used as backbones in the examples were synthesized using chemical vapor deposition methods. After dispersing 20 nm to 40 nm gold nanoclusters (Ted Pella) on an Si wafer with 600-nm-thick SiO$_2$ layer, the substrate was placed in a horizontal quartz reactor, heated to 440° C. under vacuum, followed by the flow of 3 sccm (standard cubic centimeters per minute) of SiH$_4$, 2 sccm of B$_2$H$_6$(100 ppm in H$_2$), and 60 sccm of H$_2$ for 20 min, with the growth pressure maintained at 40 Torr. To prepare Si/SiO$_2$ core-shell nanowires, bare Si nanowires were subject to dry oxidation under an O$_2$ atmosphere at 700° C. for 1 hr to 3 hr, which produced an oxide layer of 3 nm to 6 nm. To prepare Si/ZrO$_2$ or other oxide sheathed Si backbones, atomic layer deposition (ALD) was employed to deposit the dielectrics.

Selective deposition of Au nanoparticles on Si or Si/SiO$_2$ core-shell backbones. For the deposition of Au nanoparticles on bare Si nanowires, galvanic surface reduction was used. First, Si nanowires were etched in 5% HF solution for 1 min to produce an H-terminated surface, which had sufficiently low electrochemical potential to reduce Au(III) to Au(0); then, the Si nanwoires were-immersed into an HAuCl$_4$ solution to realize the in situ deposition of Au nanoparticles on the nanowire surface. $C_{HAuCl_4}$ (concentration) and the deposition time were used to control this process, and these experiments showed that good results, in terms of reasonable Au nanoparticle density and narrow size distribution, were achieved when $C_{HAuCl_4}$ falls in the range of $0.5 \times 10^{-5}$ M to $5 \times 10^{-5}$ M with a deposition time of 3 to 20 min. Higher $C_{HAuCl_4}$ and/or longer deposition times favored the formation of larger Au nanoparticles.

For the deposition of Au nanoparticles on Si/SiO$_2$ core-shell nanowires, a method called polylysine assisted adsorption was employed. First, Si/SiO$_2$ nanowire surfaces were functionalized with positively charged poly-lysine molecules by immersing the nanowires into a 1% poly-lysine solution (Ted Pella), followed by thorough rinse with DI (deionized) water. Then, citrate stabilized Au nanoparticles were readily introduced onto the functionalized nanowire surface in a controllable manner, as a result of electrostatic attraction.

Synthesis of Si/Ge and Si/SiO$_2$/Ge branched nanostructures. The nanowire-Au nanoparticle composites were dispersed onto an oxidized silicon wafer and subject to branch growth. The substrate was placed in the horizontal quartz reactor, and annealed at 450° C. under an H$_2$ atmosphere for 10 min; this annealing step was found to be important in some cases for the growth of both Si/Ge and Si/SiO$_2$/Ge branched nanostructures. In the former case, the alloying between Si nanowire backbones and Au nanoparticles may favor the epitaxial growth of Ge branches; for the latter case, it would not only burn out the organic capping layer of the citrate stabilized commercial Au nanoparticles, which proved to be an important step in some cases, but also strengthened the adhesion between SiO$_2$ and Au and increase the intimacy between the SiO$_2$ layer and Ge branches. Then, the temperature was lowered to 290° C., and the growth of Ge branches were initiated by the flow of 10 sccm GeH$_4$ (10%), 10 sccm PH$_3$ (1000 ppm in H$_2$), and 200 sccm H$_2$ for 15 min, with the growth pressure maintained at 200 Torr.

Synthesis of Si/Au and Si/SiO$_2$/Au branched nanostructures. The seeded nanowires were dispersed onto a SiO$_2$ substrate and subjected to mild annealing at 200° C. for 10 min. Then the substrate was immersed into a solution containing gold tetrachloride acid ($2 \times 10^{-4}$ M to $1 \times 10^{-3}$ M), ascorbic acid ($4 \times 10^{-4}$ M to $2 \times 10^{-3}$ M) and cetyl trimethyl ammonium bromide (CTAB) (0.025 M to 0.1 M). The reaction was conducted in the dark for 12-24 hr. Finally, the substrate was rinsed thoroughly with hot DI water and ethanol, followed by O$_3$/UV treatment at 300° C. for 3 min. It should be noted that the O$_3$/UV treatment could not only clean the nanomaterial surface, but strengthen the adhesion between Si/Au or SiO$_2$/Au interface as well, which may allow successful structure characterization or device fabrication.

Synthesis of Si/GaAs, Si/GaP, Si/InP, Si/CdSe, Si/ZnSe, Si/CdS and Si/ZnS branched nanostructures. These syntheses were carried out in a custom-built metal organic chemical vapor deposition (MOCVD) setup. The substrate containing Si nanowire/Au nanoparticle backbones was placed in a downstream furnace. For the growth of GaAs, GaP, InP, CdSe and ZnSe branches, a power vapor transport method was used. Generally, powders with the same composition were put into the center of a quartz tube. The powder evaporation temperature was 650° C. to 780° C., while the branch growth temperature was approximately 400° C. to 600° C. 30 sccm of H$_2$ was used as the carrier gas, and the inner tube pressure was kept at 40 torr. To grow Si/CdS and Si/ZnS branched nanostructures, Cd(S$_2$CNEt$_2$)$_2$ and Zn(S$_2$CNEt$_2$)$_2$ molecular precursors served as sources for metal and S reactants and were located at the entrance to furnace. The central furnace temperatures were 670° C. to 690° C. and 850° C. to 900° C. for the growth of CdS and ZnS branches, respectively, and downstream substrate temperatures were approximately 400° C. to 500° C. and 550° C. to 700° C., respectively.

Electronic device fabrication was directly performed on the branch growth substrate, and electrical contacts were defined using electron beam lithography. Ti/Pd contacts were used for both. Si and Ge nanowires; Ti/Al/Pd/Au contacts were used for other III-V and II-VI semiconductor nanowires. For FET devices based on core/shell nanowires, oxides at source-drain regions were selectively etched away by buffered hydrogen fluoride acid (BHF) before metal deposition.

Sensor device fabrication and measurements. 10 nm to 20-nm p-type Si nanowires with 5 nm to 8 nm Au nanoclusters on their surface (via surface reduction) were deposited onto silicon substrate with 600-nm-thick oxide layer. Arrays of Si/Au hybrid nanowires devices were fabricated via photolithography, and Pd/Ti metal contacts were thermally evaporated and were passivated by subsequent deposition of a ~50 nm thick Si$_3$N$_4$ coating. Then, the Au nanoparticle coated Si nanowires were immersed into the aforementioned Au branch growth solution for 12 hr to 24 hr. The Si/Au branched devices were thoroughly rinsed with hot distilled water and ethanol, and then cleaned in an O$_3$/UV oven for 2 min prior to surface modification.

A two-step procedure was used to covalently link anti-PSA receptors to the surface of the Au branches. First, the devices were reacted with a 10 mg/ml dimethylsulfoxide (DMSO) solution of 3,3'-dithio-bis(propionic acid N-hydroxysuccinimide ester) (Sigma-Aldrich) for about 4 hr, followed by extensive rinsing with DMSO. Anti-PSA (AbI, clone ER-PR8, NeoMarkers) was then coupled to the succinimidyl (NHS)-terminated Au branches surfaces by reaction of 10-20 microgram/ml antibody in a pH 8.4, 10 mM phosphate buffer solution for a period of 2-4 hr. Unreacted NHS groups were subsequently passivated by reaction with ethanolamine under similar conditions. Electrical measurements were then conducted using lock-in detection with a modulation frequency of 79 Hz. The modulation amplitude was 30 mV and the dc source-drain potential was set at zero to avoid electrochemical reactions. PSA and BSA protein samples in 1 micromolar phosphate buffer solution (pH, 7.4) were flowed under a flow rate of 0.30 to 0.60 ml/h through the microfluidic channel.

The stress field simulation was done using Finite Element Method (FEM) (ABAQUS software, version, 6.5-1). To simulate the stress in Si/GaAs branched structure, it was assumed that the axis of GaAs branch was <111>, while that of Si stem was <211>. The following material constants were used for simulation: modulus of elasticity, $c_{11(GaAs)}=1.18 \times 10^{11}$ Pa, $c_{12(GaAs)}=0.53 \times 10^{11}$ Pa, $c_{44(GaAs)}=0.594 \times 10^{11}$ Pa, $c_{11(Si)}=1.662 \times 10^{11}$ Pa, $c_{12(Si)}=0.664 \times 10^{11}$ Pa, $c_{44(Si)}=0.798 \times 10^{11}$ Pa, lattice constant, $a_{(Si)}=0.543$ nm, $a_{(GaAs)}=0.565$ nm; stem to branch width ratio, 2:1.

The strain energy difference between heteroepitaxial Si/GaAs branched structure and GaAs-on-Si substrate <111> silicon wafer) systems was also compared. FEM simulations showed that the elastic energies in the GaAs wire (width, 20 nm) were $5.12 \times 10^{-17}$ and $5.90 \times 10^{-17}$ J for Si/GaAs branched structure and GaAs-on-Si structure, respectively. The slightly larger energy for the latter case may be due to more junction confinement by "rigid" macroscopic Si substrate versus the nanoscopic confinement by "flexible" Si nanowire in the former case.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An article, comprising:
    a branched nanoscale wire comprising a vertex comprising at least a first segment having a first composition; a second segment having a second composition different from the first composition; and a third segment,
    wherein the vertex defines a T junction of the first, second, and third segments.

2. The article of claim 1, wherein the first segment comprises a Group IV semiconductor, and the second segment comprises a Group IV semiconductor.

3. The article of claim 1, wherein the first segment comprises a Group IV semiconductor, and the second segment comprises a Group III-V semiconductor.

4. The article of claim 1, wherein the first segment comprises a Group IV semiconductor, and the second segment comprises a Group II-VI semiconductor.

5. The article of claim 1, wherein the first segment comprises a semiconductor.

6. The article of claim 5, wherein the second segment comprises a semiconductor different from the semiconductor of the first segment.

7. The article of claim 5, wherein the second segment comprises a metal.

8. The article of claim 7, wherein the second segment comprises gold.

9. An article, comprising:
    a branched nanoscale wire comprising a vertex comprising at least a first segment having a first composition, a second segment having a second composition different from the first composition, and a third segment,
    wherein the first, second, and third segments co-intersect at the vertex, and wherein the first segment and the third segment are substantially co-linear.

10. The article of claim 9, wherein the first segment comprises a Group IV semiconductor, and the second segment comprises a Group IV semiconductor.

11. The article of claim 9, wherein the first segment comprises a Group IV semiconductor, and the second segment comprises a Group III-V semiconductor.

12. The article of claim 9, wherein the first segment comprises a Group IV semiconductor, and the second segment comprises a Group II-VI semiconductor.

13. The article of claim 9, wherein the first segment comprises a semiconductor.

14. The article of claim 13, wherein the second segment comprises a semiconductor different from the semiconductor of the first segment.

15. An article, comprising:
   a nanoscale wire backbone comprising a plurality of vertexes, each vertex defined by the co-intersection of three or more segments, wherein at least one vertex comprises a first segment having a first composition and a second segment having a second composition different from the first composition.

16. The article of claim 15, wherein the first segment comprises a Group IV semiconductor, and the second segment comprises a Group IV semiconductor.

17. The article of claim 15, wherein the first segment comprises a Group IV semiconductor, and the second segment comprises a Group III-V semiconductor.

18. The article of claim 15, wherein the first segment comprises a Group IV semiconductor, and the second segment comprises a Group II-VI semiconductor.

19. The article of claim 15, wherein the first segment comprises a semiconductor.

20. The article of claim 19, wherein the second segment comprises a semiconductor different from the semiconductor of the first segment.

* * * * *